United States Patent
Cassetti et al.

(10) Patent No.: US 10,224,957 B1
(45) Date of Patent: Mar. 5, 2019

(54) HASH-BASED DATA MATCHING ENHANCED WITH BACKWARD MATCHING FOR DATA COMPRESSION

(71) Applicant: Intel Corporation, Santa Clara, CA (US)

(72) Inventors: David Cassetti, Tempe, AZ (US); Christopher Cunningham, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/823,458

(22) Filed: Nov. 27, 2017

(51) Int. Cl.
    H03M 7/00 (2006.01)
    H03M 7/30 (2006.01)
    G06F 17/30 (2006.01)

(52) U.S. Cl.
    CPC .... H03M 7/3086 (2013.01); G06F 17/30516 (2013.01); G06F 17/30949 (2013.01); G06F 17/30985 (2013.01)

(58) Field of Classification Search
    CPC .... H03M 7/3086; H03M 7/3084; H03M 7/40; H03M 7/3088; H03M 7/42; H03M 7/30; H03M 7/4006
    USPC ............. 341/65, 67, 106, 107, 87
    See application file for complete search history.

(56) References Cited

U.S. PATENT DOCUMENTS

| | | | |
|---|---|---|---|
| 5,150,119 A * | 9/1992 | Yoshida | G06T 9/005 341/106 |
| 5,469,161 A | 11/1995 | Bezek | |
| 5,883,588 A * | 3/1999 | Okamura | H03M 7/3086 341/5 |
| 5,951,623 A * | 9/1999 | Reynar | G06T 9/005 341/106 |
| 6,061,712 A | 5/2000 | Tzeng | |
| 6,631,419 B1 | 10/2003 | Greene | |
| 6,650,261 B2 * | 11/2003 | Nelson | G06T 9/005 341/106 |
| 6,662,184 B1 | 12/2003 | Friedberg | |
| 6,735,670 B1 | 5/2004 | Bronstein et al. | |

(Continued)

OTHER PUBLICATIONS

Wikipedia, "LZ77 and LZ78," Nov. 6, 2017, 5 pages. Retrieved from <https://en.wikipedia.org/wiki/LZ77_and_LZ78#LZ77>.

(Continued)

*Primary Examiner* — Linh Nguyen
(74) *Attorney, Agent, or Firm* — Hanley, Flight & Zimmerman, LLC

(57) ABSTRACT

Example data compressors disclosed herein include a hash unit to identify a hash table entry matching a hash index determined for a current position of a data stream undergoing data compression, the hash table entry identifying one or more prior positions of the data stream. Disclosed example data compressors also include a match engine to perform data matching based on the current position of the data stream and the one or more prior positions of the data stream to determine a primary match result and a backward match result for the current position of the data stream. Disclosed example data compressors further include a results evaluator to determine an output match result for the current position of the data stream based on the primary match result for the current position of the data stream and a backward match result determined for a subsequent position of the data stream.

26 Claims, 8 Drawing Sheets

(56) References Cited

U.S. PATENT DOCUMENTS

| | | | |
|---|---|---|---|
| 7,403,137 B1 | 7/2008 | Huang | |
| 7,536,399 B2 * | 5/2009 | Itani | H03M 7/3086 |
| 7,667,630 B2 * | 2/2010 | Harada | H03M 7/3086 |
| | | | 341/106 |
| 7,814,129 B2 * | 10/2010 | Williams | H03M 7/30 |
| | | | 707/812 |
| 7,834,784 B1 | 11/2010 | Zhang et al. | |
| 7,982,636 B2 * | 7/2011 | Abali | H03M 7/3088 |
| | | | 341/51 |
| 8,635,180 B2 * | 1/2014 | Biran | G06N 5/047 |
| | | | 706/48 |
| 8,690,703 B2 * | 4/2014 | Chen | A63B 53/04 |
| | | | 473/324 |
| 8,694,703 B2 * | 4/2014 | Hans | G06F 3/0613 |
| | | | 707/797 |
| 8,766,827 B1 * | 7/2014 | Milne | H03M 7/3084 |
| | | | 341/51 |
| 8,804,950 B1 | 8/2014 | Panwar | |
| 8,880,507 B2 | 11/2014 | Kotha et al. | |
| 8,954,392 B2 * | 2/2015 | Das | H03M 7/3091 |
| | | | 707/644 |
| 9,214,954 B2 * | 12/2015 | Ogasawara | H03M 7/3059 |
| 9,280,609 B2 | 3/2016 | Liu | |
| 9,473,168 B1 * | 10/2016 | Gopal | H03M 7/3086 |
| 9,515,678 B1 * | 12/2016 | Henry | H03M 7/3086 |
| 9,647,682 B1 * | 5/2017 | Heng | H03M 7/3088 |
| 9,716,734 B2 * | 7/2017 | Bhaskar | H03M 7/3088 |
| 9,768,802 B2 | 9/2017 | Gopal et al. | |
| 9,934,234 B2 * | 4/2018 | Hubris | G06F 17/30153 |
| 2001/0043602 A1 | 11/2001 | Brown | |
| 2002/0196166 A1 | 12/2002 | Satoh et al. | |
| 2003/0102989 A1 | 6/2003 | Satoh | |
| 2004/0236720 A1 | 11/2004 | Basso et al. | |
| 2006/0106870 A1 | 5/2006 | Franaszek et al. | |
| 2006/0184556 A1 | 8/2006 | Tan et al. | |
| 2007/0071233 A1 | 3/2007 | Zak | |
| 2007/0234005 A1 | 10/2007 | Erlingsson et al. | |
| 2007/0279261 A1 | 12/2007 | Todorov et al. | |
| 2008/0177812 A1 | 7/2008 | Brandle | |
| 2009/0097654 A1 | 4/2009 | Blake | |
| 2010/0023726 A1 | 1/2010 | Aviles | |
| 2011/0154169 A1 * | 6/2011 | Gopal | H03M 7/3084 |
| | | | 714/807 |
| 2012/0016882 A1 | 1/2012 | Tofano | |
| 2014/0223029 A1 | 8/2014 | Bhaskar et al. | |
| 2015/0280736 A1 | 10/2015 | Ogasawara et al. | |

OTHER PUBLICATIONS

Wikipedia, "Lempel-Ziv-Storer_Szymanski," Mar. 21, 2018, 2 pages. Retrieved from <https://en.wikipedia.org/wiki/Lempel-Ziv-Storer-Szymanski>.

Deutsch, "RFC 1951—Deflate Compressed Data Format Specification", Version 1.3, May 1996, 16 pages.

Sadakane et al., "Improving the Speed of LZ77 Compression by Hashing and Suffix Sorting", IEICE TRANS. Fundamentals, vol. E83-A, No. 12, Dec. 2000, 10 pages.

Huffman, "A Method for the Construction of Minimum-Redundancy Codes", Proceedings of the I.R.E., Sep. 1952, pp. 1098-1101, 4 pages.

Ziv et al. "A Universal Algorithm for Sequential Data Compression", IEEE Transactions on Information Theory, vol. IT-23, No. 3, May 1977, 7 pages.

* cited by examiner

FIG. 4

HASH-BASED DATA MATCHING ENHANCED WITH BACKWARD MATCHING FOR DATA COMPRESSION

FIELD OF THE DISCLOSURE

This disclosure relates generally to data compression and, more particularly, to hash-based data matching enhanced with backward matching for data compression.

BACKGROUND

Many data compressors, such as those based on the LZ77 compression algorithm, perform data compression by replacing repeated data strings in an input data stream with pointers to prior positions of the repeated strings in the input data stream. Data compression is achievable because the pointers are typically smaller than the repeated data strings they replace. To find the repeated data strings in an input data stream, some implementations of such data compressors utilize hash chain matching. In hash chain matching, a hash table is constructed with each entry corresponding to a respective data substring that was found previously in the input data stream. Each entry of the hash table points to a respective hash chain storing one or more prior positions (e.g., addresses) in the input data stream at which the particular data substring corresponding to the respective hash table entry was found. Data compressors utilize such hash chains to limit the number of prior positions in the input data buffer to be searched when attempting to find a prior data string that matches a current data string beginning at the current position of the input data stream undergoing compression.

BRIEF DESCRIPTION OF THE DRAWINGS

FIGS. 3-4 illustrate examples of hash-based data matching enhanced with backward matching capable of being performed by the data redundancy searcher of FIGS. 1 and/or 2.

The figures are not to scale. Wherever possible, the same reference numbers will be used throughout the drawing(s) and accompanying written description to refer to the same or like parts, elements, etc.

DETAILED DESCRIPTION

Figure 1:
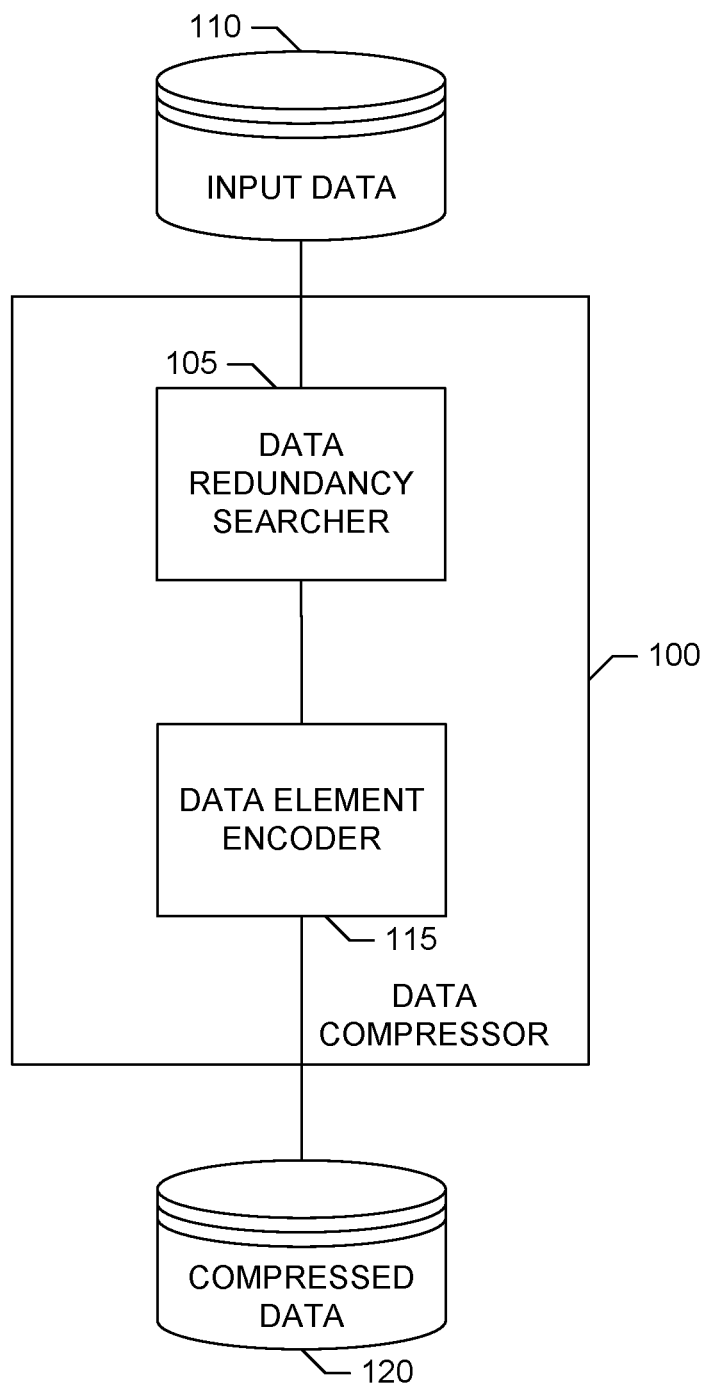
FIG. 1 is a block diagram of an example data compressor including an example data redundancy searcher constructed to perform hash-based data matching enhanced with backward matching for data compression in accordance with the teachings of this disclosure.

Example methods, apparatus, systems and articles of manufacture (e.g., non-transitory physical storage media) to enhance hash-based data matching with backward matching for data compression are disclosed herein. Example data compressors disclosed herein include an example hash unit to identify a hash table entry matching a hash index determined for a current position of a data stream undergoing data compression. The hash table entry identifies (e.g., points to) one or more prior positions of the data stream. Disclosed example data compressors also include an example match engine to perform data matching based on the current position of the data stream and the one or more prior positions of the data stream to determine a primary match result and at least one backward match result for the current position of the data stream. The primary match result specifies a location and a length of a first prior data string in the data stream matching data beginning at the current position of the data stream. The backward match result specifies a length of a second prior data string in the data stream beginning at least one position before the location of the first prior data string and matching data beginning at least one position before the current position of the data stream. Disclosed example data compressors further include an example results evaluator to determine an output match result for the current position of the data stream based on the primary match result for the current position of the data stream and a backward match result determined for a subsequent position of the data stream.

In some disclosed examples, a number of prior positions of the data stream the hash table entry is permitted to identify (e.g., point to) is limited to a search depth. Additionally or alternatively, in some disclosed examples, the match engine is configured with a backward matching depth corresponding to a number of the backward match results to be determined for the current position of the data stream.

Additionally or alternatively, in some disclosed examples, the backward match result for the current position of the data stream is a first backward match result for the current position of the data stream, and respective positions of the data stream correspond to respective bytes of the data stream. In some such disclosed examples, to perform the data matching, the match engine is to compare the data beginning at the current position of the data stream with data beginning at a first one of the prior positions of the data stream to determine the location and the length of the first prior data string in the data stream. Furthermore, in such disclosed examples, the match engine is to compare data bytes at respective positions before the location of the first prior data string to respective data bytes located at respective positions before the current position of the data stream to determine respective backward match results, including the first backward match result, for the current position of the data stream, the respective backward match results being associated with the respective positions before the current position of the data stream. For example, if the respective data byte located one position before the location of the first prior data string matches the respective data byte located one position before the current position of the data stream, the match engine can determine the first backward match result by adding one to the length of the first prior data string to determine the length of the second prior data string in the data stream. However, if the respective data byte located one position before the location of the first prior data string does not match the respective data byte located one position before the current position of the data stream, the match engine can determine the first backward match result by setting the length of the second prior data string in the data stream to zero.

Additionally or alternatively, in some disclosed examples, to determine the output match result for the current position of the data stream, the results evaluator is to select the backward match result for the subsequent position of the data stream to be the output match result for the current position of the data stream if a length of the backward match result for the subsequent position of the data stream is greater than the length of the primary match result for the current position of the data stream. However, in some such examples, the results evaluator is to select the primary match result for the current position of the data stream to be the output match result for the current position of the data stream if the length of the backward match result for the subsequent position of the data stream is not greater than the length of the primary match result for the current position of the data stream.

Furthermore, in some such disclosed examples, the subsequent position is a first subsequent position of the data stream located one position after the current position of the data stream, and the backward match result for the first subsequent position is associated with a location of the data stream one position before the first subsequent position. In some such examples, to determine the output match result for the current position of the data stream, the results evaluator is further to select a backward match result for a second subsequent position of the data stream to be the output match result for the current position of the data stream if a length of the backward match result for the second subsequent position of the data stream is greater than the length of the backward match result for the first subsequent position of the data stream and the length of the primary match result for the current position of the data stream, provided the second subsequent position is located two positions after the current position of the data stream, and the backward match result for the second subsequent position being associated with a location of the data stream two positions before the second subsequent position. However, in some such examples, the results evaluator is to select the backward match result for the first subsequent position of the data stream to be the output match result for the current position of the data stream if the length of the backward match result for the second subsequent position of the data stream is not greater than the length of the backward match result for the first subsequent position of the data stream and the length of the backward match result for the first subsequent position of the data stream is greater than the length of the primary match result for the current position of the data stream. However, in some such examples, the results evaluator is to select the primary match result for the current position of the data stream to be the output match result for the current position of the data stream if the length of the backward match result for the first subsequent position of the data stream and the length of the backward match result for the second subsequent position of the data stream are not greater than the length of the primary match result for the current position of the data stream.

These and other example methods, apparatus, systems and articles of manufacture (e.g., non-transitory physical storage media) to enhance hash-based data matching with backward matching for data compression are disclosed in further detail below.

As noted above, many data compressors perform data compression by replacing repeated data strings in an input data stream with one version of the data string and pointers to prior positions of the other repeated strings in the input data stream. For example, LZ77 compression involves finding previous occurrences of substrings that match data beginning at a current position input data stream and is the basis of many lossless compression algorithms in use today for general data exchange and storage (e.g. gzip, zlib, LZ4, etc.) Some such data compressors further utilize hash chain matching to reduce the number of prior positions in the input data buffer to be searched when attempting to find a prior data string that matches a current data string beginning at a current position of the input data buffer undergoing compression. For example, a hash table can be used to store potential matches, which because of collisions (e.g., due to multiple matches or false matches), result in a linked-list, or hash chain, of prior addresses that are to be searched for prior data string(s) that match the current data string. To reduce resource utilization, processing time, etc., for performing data compression, a search depth may be used to limit the maximum number of linked-list addresses permitted to be searched for a given hash table entry. However, although achieving processing efficiency, use of a search depth to limit the search space for finding prior matching data strings may negatively impact the achievable compression ratios.

In contrast with prior compression techniques employing hash-based matching with a limited search depth, disclosed example data compressors employ hash-based matching enhanced with backward matching, which can achieve better compression ratios at a given search depth than prior techniques, and/or can achieve the same compression ratio as prior techniques, but at reduced search depths. As disclosed in further detail below, example data compressors implementing backward matching as disclosed herein utilize a hash table with a limited search depth to determine a primary match result specifying a length and location (e.g., offset) for a prior data string that matches data beginning at a current position of the input data stream. However, in addition to determining the primary match result for the current data stream position, disclosed example data compressors perform backward matching to also determine, with just a few additional data comparisons, one or more backward match results for the current position of the input data stream, with the number of backward match results corresponding to a backward matching depth supported by the data compressor. Each such backward match result specifies the length of another prior data string beginning one or more positions before the location of the primary match result's data string and matching respective data beginning one more positions before the current position of the input data stream undergoing compression. Then, disclosed example data compressors can evaluate the primary match result determined for the current data stream position against one or more backward match results determined for one or more subsequent positions of the input data stream, but that align with the current position, to select the match result having the longest prior matching data stream for the current data stream position.

Because subsequent data stream positions may have hash indices matching hash table entries with addresses pointing further back into the input data stream's history, the backward match results for these subsequent data stream positions provide further opportunities to find a better (e.g., longer) prior matching data string for a given (e.g., current) input data stream position undergoing compression. The ability to find longer, prior matching data strings for a given search depth can yield higher compression ratios than are achievable with prior compression techniques. For example, with a backward matching depth of 3 bytes, example data compressors employing backward matching as disclosed herein may be able to achieve compression ratios for search depths of 16 or 32 that are better than the compression ratios able to be achieved by prior data compressors employing longer search depths of 32 or 64, respectively.

Turning to the figures, a block diagram of an example data compressor 100 including an example data redundancy searcher 105 constructed to perform hash-based matching enhanced with backward matching for data compression in accordance with the teachings of this disclosure is illustrated in FIG. 1. The example data compressor 100 of FIG. 1 implements data compression, such as any data compression algorithm based on LZ77 compression, by searching for and replacing repeated data strings in an input data stream with pointers to prior positions of the repeated strings in the input data stream. For example, the structure of the example data compressor 100 of FIG. 1 is compatible with the DEFLATE compression algorithm as specified by the Internet Engineering Task Force (IETF) in RFC 1951. DEFLATE compression utilizes a combination of an LZ77 compression algorithm to find repeated strings in an input data buffer, and Huffman coding to code the data elements output by the LZ77 compression algorithm.

Accordingly, the example data compressor 100 of FIG. 1 includes the example data redundancy searcher 105 to search for and replace repeated data strings in an input data stream stored in an example input data buffer 110 with pointers to prior positions of the repeated strings in the input data stream. Thus, in some examples, the data redundancy searcher 105 can be used to implement the LZ77 compression portion of the DEFLATE compression algorithm. In the illustrated example of FIG. 1, the data compressor 100 also includes an example data element encoder 115 to encode the data elements determined by the example data redundancy searcher 105 for form a compressed data stream that is output to an example compressed data buffer 120. Thus, in some examples, the data element encoder 115 can be used to implement the Huffman coding portion of the DEFLATE compression algorithm. As disclosed in further detail below, the data redundancy searcher 105 of the illustrated example implements backward matching to find prior data strings that match data at current data stream locations undergoing compression.

As noted above, the data redundancy searcher 105 searches for repeated data strings in an input data stream stored in the input data buffer 110 and replaces the repeated strings with pointers to prior positions of the repeated strings in the input data stream. In some examples, a given pointer for a given repeated data string matching data at the current input buffer position being compressed includes a length of the repeated data string and a location of the repeated data string in the input data stream, which may be an offset or relative, backwards distance from the current input buffer position back to starting position of the repeated data string in the input data stream. Thus, the pointer to the given repeated data string may be represented as a data pair <length, location> (or, equivalently, <length, offset>). The DEFLATE compression algorithm restricts the location values to be no more than 32 Kbytes, and the length values to be no more than 258 bytes.

If the data redundancy searcher 105 of the illustrated example finds a prior repeated data string for the current input data stream position, the data redundancy searcher 105 outputs the pointer (e.g., the data pair <length, location>) for the repeated data string and then advances the current position of the input buffer that is to undergo compression by the length of the repeated data string. However, if the data redundancy searcher 105 of the illustrated example does not find a repeated prior data string for the current input data stream position, the data redundancy searcher 105 outputs one or more literal bytes containing the actual byte(s) of data at the current input data stream position being compressed, and advances the current position of the input data stream that is to undergo compression by the number of literal bytes that were output (e.g., by 1 or some other value).

Thus, the data elements output by the example data redundancy searcher 105 of FIG. 1 include (i) literal bytes and (ii) pointers (e.g., data pairs having the form <length, location>) for repeated data strings. The example data element encoder 115 of FIG. 1 encodes the literal bytes and repeated string pointers output by the data redundancy searcher 105 for inclusion in compressed data stream corresponding to the input data stream, and stores the compressed data stream in the output compressed data buffer 120. For example, to implement the DEFLATE compression algorithm, the data element encoder 115 can encode the data elements (e.g., the literal bytes and repeated string pointers) output by the data redundancy searcher 105 using Huffman coding to further reduce the size of the output compressed data stream (e.g., in addition to the data size reduction achieved by the repeated string matching and replacement performed by the data redundancy searcher 105).

In the illustrated example of FIG. 1, the data redundancy searcher 105 maintains a hash table to facilitate searching for repeated data strings in the input data buffer 110. In some examples, the hash table maintained by the data redundancy searcher 105 includes hash table entries having respective hash chains, such as linked lists, storing pointers (e.g., addresses) to prior positions in the input data stream for each three (3) byte substring found in the input data stream. In some examples, each 3-byte substring found in the input data stream forms a prefix that is used to index into a hash table containing pointers to the respective hash chains being maintained by the data redundancy searcher 105. Although 3-byte substrings/prefixes are utilized by the data redundancy searcher 105 of the illustrated example, substrings/prefixes of any length (e.g., 2 bytes, 4 bytes, etc.) could alternatively be used.

For example, the hash chain data structure maintained by the data redundancy searcher 105 can include a hash table storing a set of hash table indices corresponding to the 3-byte substrings/prefixes currently found in the input data stream stored in the input data buffer 110. To reduce the size of the hash table, in some examples, the 3-byte substrings/prefixes are hashed with a hashing function to reduce the size of the hash chain indices from 3×8=24 bits to a fewer number of bits (e.g., 8 bits, 10 bits, 12 bits, or some other value), thereby reducing the size of the hash table to be maintained by the data redundancy searcher 105. For each hash table index stored in the hash table, the hash table also includes a pointer, in memory, to the corresponding hash chain, which is indexed by that hash table index. The hash chain indexed by a given hash table index represents a history buffer of pointers (e.g., addresses) identifying the prior positions in the input data stream of the 3-byte substring/prefix corresponding to the given hash table index. In some examples, the hash chains are implemented by linked lists or any other appropriate data structure.

In prior hash chain matching implementations, hash chain processing proceeds as follows. When performing compression of data beginning at a current position of the input data stream, a prior data compressor accesses the next 3-byte substring/prefix beginning at the current position, hashes the 3-byte substring/prefix to obtain the corresponding hash table index, and accesses the particular hash chain corresponding to the hash table entry indexed by that hash table index. Then, the prior data compressor searches the input data stream at the prior positions addressed in the hash chain to find the longest prior string that matches a data string beginning at the current position of the input data stream (and, thus, starting with the 3-byte substring/prefix corresponding to the selected hash chain). However, as noted above, a search depth may be specified, configured or otherwise used to limit the size of the hash chains by limiting the number of pointers (e.g., addresses) to the prior data stream positions that can be stored for a given hash table index. Examples of search depths include, but are not limited to, 4, 8, 16, 32, 128, 256, 1024, 4096, etc., or some other number of pointers (e.g., addresses) to prior data stream positions. Such search depth limits can reduce resource utilization, processing time, etc., for performing data compression. However, use of a search depth to limit the search space for finding prior matching data strings may negatively impact the achievable compression ratios.

To improve compression ratios achievable with use of a search depth limit, the data redundancy searcher 105 of the illustrated example implements hash-based matching as described above, but enhanced with backwards matching as disclosed herein. For example, to compress data beginning at a current position of the input data stream, the data redundancy searcher 105 accesses the next 3-byte substring/prefix beginning at the current position, hashes the 3-byte substring/prefix to obtain the corresponding hash table index, and accesses the particular hash chain corresponding to the hash table entry indexed by that hash table index. The data redundancy searcher 105 then performs data matching at the prior stream position(s) addressed by the hash chain to determine a primary match result specifying the length and location (e.g., offset) for a longest prior data string beginning at the prior position(s) addressed by the hash chain that matches a data string beginning at the current position of the input data stream (and, thus, starting with the 3-byte substring/prefix corresponding to the selected hash chain). However, in addition to determine the primary match result for the current data stream position, the data redundancy searcher 105 also determines one or more backward match results for the current position of the input data stream, with the number of backward match results corresponding to a backward matching depth supported by the data redundancy searcher 105. Each such backward match result specifies the length of another prior data string beginning one or more positions before the location of the primary match result's prior data string and matching respective data beginning one or more positions before the current position of the input data stream undergoing compression. Then, disclosed example data compressors can evaluate the primary match result determined for the current data stream position against one or more backward match results determined for one or more subsequent positions of the input data stream, but that align with the current position, to select the match result having the longest prior matching data stream for the current data stream position.

Figure 2:
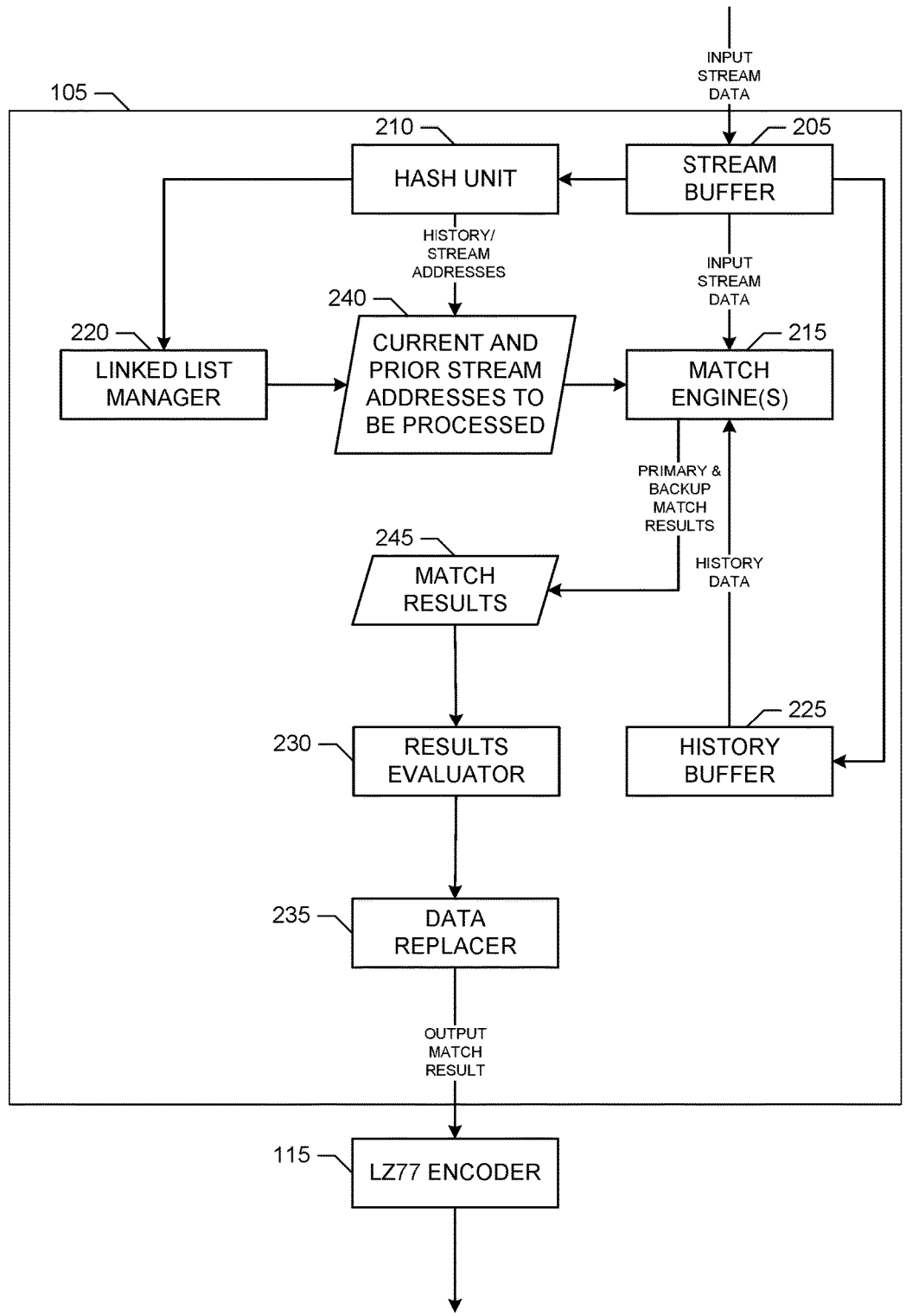
FIG. 2 is a block diagram of an example implementation of the data redundancy searcher of FIG. 1.

Because subsequent data stream positions may have hash indices matching hash table entries with addresses pointing further back into the input data stream's history, the backward match results for these subsequent data stream positions provide further opportunities for the data redundancy searcher 105 to find a better (e.g., longer) prior matching data string for a given (e.g., current) input data stream position undergoing compression. The ability to find longer, prior matching data strings for a given search depth can yield higher compression ratios than are achievable with prior compression techniques. Moreover, the data redundancy searcher 105 is able to determine each backward match result for a given data stream position based on the primary search result for that position and just a few additional byte comparisons, thereby having an almost negligible impact on the processing resources and time utilized by the data redundancy searcher 105 over prior techniques. An example implementation of the data redundancy searcher 105 is illustrated in FIG. 2, which is described in further detail below.

The example data compressor 100 of FIG. 1 is structured to process any type of input data. Accordingly, the example input data buffer 110 employs any appropriate data structure(s), data format(s), etc., to store any one or more types of input data to be compressed, such as, for example, text (e.g., alphanumeric) data (e.g., corresponding to any language), multimedia data (e.g., audio data, video data, image data, etc.), binary data (e.g., corresponding to any file format), etc. In the illustrated example, the example compressed data buffer 120 employs any appropriate data structure(s), data format(s), etc., to store compressed data corresponding to the type(s) of input data stored in the input data buffer 110. The example input data buffer 110 and/or the example compressed data buffer 120 can be stored in any type(s) and/or number of memories, storage devices, etc., such as the example mass storage device 828 and/or the example volatile memory 814 in the example processor platform 800 of FIG. 8, which is described in further detail below.

In some examples, the data compressor 100 of FIG. 1 is implemented as a stand-alone data compression device (e.g., for inclusion in a data transmission system, such as a video transmission system, a wireless data transmission system, etc.) In some examples, the data compressor 100 of FIG. 1 is integrated into another device, system, etc. (e.g., such as a web server, a mobile device, a personal computer, a computer processor, etc.).

Although the illustrated example data compressor 100 of FIG. 1 is described from the perspective of implementing the DEFLATE compression algorithm, hash-based matching enhanced with backward matching for data compression as disclosed herein is not limited thereto. On the contrary, hash-based matching with backward matching, as disclosed herein, can be used with any compression algorithm that searches the input data being compressed for matching prior repeated data strings. As such, the example data compressor 100 of FIG. 1 can be used to implement other compression algorithms in addition to, or as an alternative to, the DEFLATE compression algorithm. Examples of such data compression algorithms include, but are not limited to, LZ77, LZO, LZF, LZ4, QuickLZ, FastLZ, Google's® Snappy algorithm, etc.

A block diagram illustrating an example implementation of the data redundancy searcher 105 of FIG. 1 is illustrated in FIG. 2. Operation of the example data redundancy searcher 105 of FIG. 2 is illustrated by way of example in FIGS. 3-4. The example data redundancy searcher 105 of FIG. 2 includes an example stream buffer 205, an example hash unit 210, one or more example match engines 215, an example linked list manager 220, an example history buffer 225, an example results evaluator 230 and an example data replacer 235. The data redundancy searcher 105 of the illustrated example includes the stream buffer 205 to access the example input data buffer 110 and read data strings beginning at a current input data stream position maintained by the stream buffer 205. For example, the stream buffer 205 may be structured to read data formatted as 1 byte (8 bit) chunks corresponding to alphanumeric characters, and/or formatted into smaller chunks, larger chunks, etc. After a compression cycle, the stream buffer 205 of the illustrated example is responsible for incrementing the current input data stream position (e.g., by the length of the matching prior repeated string or by the number of literals output if no matching string is found) to the next input data stream position that is to undergo compression. In some examples, to achieve higher throughput, the stream buffer 205 accesses multiple bytes (e.g., such as 16 bytes or some other number of bytes) for processing in parallel.

The data redundancy searcher 105 of the illustrated example includes the example hash unit 210, which includes hash table entries having respective hash chains, such as linked lists, storing pointers (e.g., addresses) to prior positions in the input data stream for data strings (e.g., prefixes of 3 bytes for the DEFLATE format, or some other length) already observed in the input data stream. In the illustrated examples, for each input byte accessed by the stream buffer 205, a prefix corresponding to the input byte and the following few bytes, such as 3 bytes total for the DEFLATE format, is hashed by the hash unit 210 to generate a hash index identifying an entry of the hash table maintained in the hash unit 210. The hash table entry supplies one or more history addresses pointing to prior positions in the input data stream at which prior 3-byte strings hashed to the same value as the hash index. The history addresses and corresponding input data stream addresses are provided the match engine(s) 215 to perform data searching to confirm that the 3-byte match is valid, and, if possible, find a prior match for the input data beginning at the current input data stream position that is longer than 3 bytes.

In the illustrated example, if the search depth supported by the hash unit 210 is greater than the number of addresses that can be stored by a given hash table entry, the remaining history addresses are provided by the linked list manager 220. For example, the hash table maintained by the hash unit 210 may be stored in fast memory, such as cache memory, which has limited storage space. In contrast, the linked list manager 220 may have more storage space implemented using slower memory, which is not accessed unless the number of history addresses for a given hash table entry exceeds the storage depth of the hash unit 210.

In the illustrated example, the data redundancy searcher 105 includes the match engine(s) 215 to search the prior position(s) addressed by a particular hash chain indexed by the particular hash chain index determined by the example hash unit 210 for the current input data prefix to find one or more prior repeated data strings that match data beginning at the current input data stream position undergoing compression. In some examples, the data redundancy searcher 105 includes multiple match engines 215 to perform data searching for multiple input data stream positions in parallel. For example, the number of match engines 215 may correspond to the backward matching depth supported by the data redundancy searcher 105, which enables the primary match result and the backward match results for the appropriate subsequent data stream positions to be generated simultaneously in parallel, thereby reducing latency associated with evaluating these results to select an output match result for the current data stream position.

In the illustrated example, a given match engine 215 receives a current data stream position, such as in the form of a current data stream address, from the stream buffer 205, as well as one or more prior data stream positions, such as in the form or one or more history address, from the hash unit 210. In the illustrated example of FIG. 2, the current data stream and history addresses to be processed by the match engine 215 are represented by block 240. The match engine 215 compares the data in the stream buffer 205 beginning at the current input data stream position with prior stream data corresponding to the prior positions (e.g., history addresses) provided by the hash unit 210. In the illustrated example, the prior stream data is stored in the history buffer 225, which maintains a history of the prior input stream data that has already undergone compression.

In the illustrated example, a given match engine 215 is also structured to compare a limited number of bytes backward from the current input data stream position with corresponding bytes backward from a given prior data stream position undergoing data matching. For example, the number of backward bytes may correspond to a specified, configured or otherwise used backward matching depth, such as 3 bytes or some other value, supported by the match engine 215. In some examples, the match engine 215 of the illustrated example determines one or more primary match results for the current stream position, with each primary match results corresponding to a different prior data stream position provided by the hash unit 210 and representing a matching prior data string, if any, found at the prior data stream position and that matches data beginning at the current input data stream position. In some such examples, the match engine 215 also returns a set of one or more backward match results corresponding to the different prior data stream positions provided by the hash unit 210. The primary and backward match results determined by the match engine 215 for the current input data stream position are represented by block 245 in FIG. 2.

For example, for a given prior data stream position provided by the hash unit 210, the match engine 215 may return a number of backward match results equal to the backward matching depth. In such examples, if the backward matching depth is 3, then the match engine 215 may return 3 backward match results, with a first backward match result corresponding to one position before the current data stream position and one position before the given prior data stream position being matched (e.g., also referred to as position minus 1), a second backward match result corresponding to two positions before the current data stream position and two positions before the given prior data stream position being matched (e.g., also referred to as position minus 2) and a third backward match result corresponding to three positions before the current data stream position and three positions before the given prior data stream position being matched (e.g., also referred to as position minus 3). In some examples, a primary match result includes of a length and a location (e.g., such as an offset corresponding to a different between the current input data stream position and the history address of the prior data stream position being matched) of the prior matching data string that matched data beginning at the current position of the input data stream. In some examples, the backward match results corresponding to a given prior data stream position include just the length information for the matching data streams, as the locations of the backward match results can be derived from the location of the primary match result corresponding to the given prior data stream position (e.g., by subtracting the number of backward bytes corresponding to the given backward match result).

In some examples, a given match engine 215 starts performing data matching by reading input stream data from the stream buffer 205 and history data from the history buffer 225 based on the current and prior stream addresses 240. In some examples, the match engine 215 further adjusts the current and prior stream read addresses 240 by subtracting the backward matching depth (e.g. 3 bytes). Therefore, in such examples, the first 3 bytes of the returned input stream and history data represent backward match data. In such examples, the match engine 215 compares the first 3 bytes of the input stream data with the history data at the addressed positions and records the backward match results (e.g., 1 match flag per backward byte position) for later use in determining the length of the matching strings at these backward match positions. The match engine 215 then compares the remaining data to determine the match length for the primary search result corresponding to the current input data stream position. If all remaining data read so far from the stream and history buffers match for the positions being compared, the match engine 215 then performs additional read(s) from the stream buffer 205 and history buffer 225, continues comparing the current and prior history data for the input data stream, and continues updating the match length as long as matching is successful. The data matching process continues until the match fails, or the maximum match length (e.g. 258 bytes for DEFLATE) is reached, at which point the match engine 215 determines the length and distance for primary match result corresponding to the current input data stream position. The match engine 215 then further determines the lengths for the backward match results for the backward byte positions based on the previously stored backward match flags.

For example, to determine the length of the matching string, if any, associated with the first backward match result (e.g., position minus 1) for the current input data stream position, the match engine 215 increments the length of the primary match result by 1 if the backward match flag corresponding to this bit position (e.g., position minus 1) indicates a match. However, if the backward match flag corresponding to this bit position (e.g., position minus 1) does not indicate a match, the match engine 215 sets the length of the matching string associated with the first backward match result (e.g., position minus 1) to be zero. Similarly, to determine the length of the matching string, if any, associated with the second backward match result (e.g., position minus 2) for the current input data stream position, the match engine 215 increments the length of the primary match result by 2 if the backward match flags corresponding to this bit position (e.g., position minus 2) and the next bit position (e.g., position minus 1) both indicate successful matches. However, if the backward match flag corresponding to either (or both) of these backward positions do not indicate a match, the match engine 215 sets the length of the matching string associated with the second backward match result (e.g., position minus 2) to be zero. Similarly, to determine the length of the matching string, if any, associated with the third backward match result (e.g., position minus 3) for the current input data stream position, the match engine 215 increments the length of the primary match result by 3 if the backward match flags corresponding to this bit position (e.g., position minus 3) and the next two bit positions (e.g., position minus 1 and position minus 2) all indicate successful matches. However, if the backward match flag corresponding to any (or all) of these backward positions do not indicate a match, the match engine 215 sets the length of the matching string associated with the third backward match result (e.g., position minus 3) to be zero. As a numerical example, if the primary match result for the current input data stream position has a match length of 3, and the flag for the first backward match result (e.g., position−1) indicates a match, then a length of 4 is stored for the first backward match (e.g., position−1).

In some examples, the match engine 215 stores the best (e.g., longest) primary and backward match results 245 determined for a current position of the input data stream undergoing compression. Then, once the primary and backward match results 245 for a sufficient number of subsequent positions of the input stream are available (e.g., corresponding to the backward matching depth), sufficient match results are available for determining the output match results for the current input data stream position. In some examples, after those match results are available, input stream data stored in the stream buffer 205 is transferred to the history buffer 225 to be used for comparison with subsequent input data.

The data redundancy searcher 105 of the illustrated example includes the results evaluator 230 to evaluate and select the output match result for the current input data stream position based on the primary match results determined for the current input data stream position and the backward match results determined for subsequent data stream positions, but that align with the current input data stream position. For example, to determine the result for the current input data stream position assuming a backward matching depth of 3, the results evaluator 230 ensures that the backward match results for the next 3 subsequent positions, (e.g., current position+1, current position+2) and (current position+3) are also present. Once these results are present, and results evaluator 230 finds the best match (e.g., having the longest matching data string length) from among the group of match results including: (a) the primary match result for the current input data stream position—denoted symbolically as match(current position)[current position]; (b) the first backward match result for the next subsequent input data stream position (e.g., one position after the current position)—denoted symbolically as (current position+1) [backward−1]; (c) the second backward match result for the second subsequent input data stream position from (e.g., two positions after) the current position—denoted symbolically as (current position+2)[backward−2]; and (d) the third backward match result for the third subsequent input data stream position from (e.g., three positions after) the current position—denoted symbolically as (current position+3)[backward−3]. The best match for the current input data stream position is then provided to the data replacer 235, which outputs the pointer (e.g., the data pair <length, location>) to the best match result if a prior repeated data string was found, or outputs the one or more literal bytes containing the actual byte(s) of data at the current input data stream position if a prior repeated data string was not found, as described above. In the illustrated example, the data replacer 235 outputs the pointer or literal byte(s) to the data element encoder 115, which is represented by an LZ77 encoder in the illustrated example, for encoding as described above.

Figure 3:
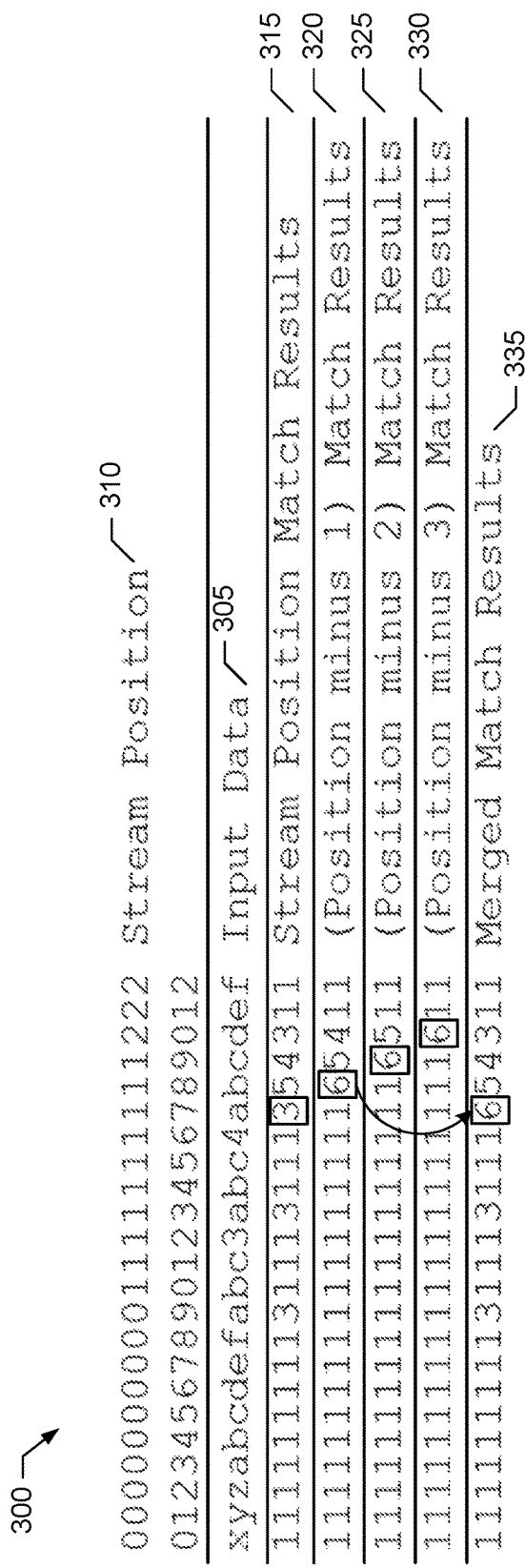

FIG. 3 illustrates an example backward matching procedure 300 performed by the example data redundancy searcher 105 of FIGS. 1 and/or 2 to determine match results for given positions of an input data stream. The example backward matching procedure 300 illustrates how backward matching as disclosed herein can improve match results when hash-based matching with a limited search depth is used for data compression. The example backward matching procedure 300 illustrates operation of the data redundancy searcher 105 with a search depth of 2 bytes and a backward matching depth of 3 bytes on 23 bytes of example input data 305 at input data stream positions 310. For example, FIG. 3 illustrates example primary match results 315, example first (e.g., position minus 1) backward match results 320, example second (e.g., position minus 2) backward match results 325 and example third (e.g., position minus 3) backward match results 330 determined by the data redundancy searcher 105 for each position 310 of the input data 305. FIG. 3 also illustrates resulting example output match results 335 determined by the data redundancy searcher 105 for each position 310 of the input data 305 based on the primary match results 315, the first (e.g., position minus 1) backward match results 320, the second (e.g., position minus 2) backward match results 325 and the third (e.g., position minus 3) backward match results 330. In the illustrated example of FIG. 3, the lengths of the respective search results 315-335 are depicted, but the distances/offsets of the respective search results 315-335 are omitted for clarity.

In the illustrated example backward matching procedure 300 of FIG. 3, unique 3-byte substrings in the input data stream 305 are assumed to have a unique hash and, thus, hash collisions are due to multiple occurrences in history of the same substring. Because the search depth is only 2 in the illustrated example, when the 3 bytes of input data having values 'abc' starting at stream position 17 are hashed, the hash unit 210 of the data redundancy searcher 105 supplies only 2 history addresses (e.g., stream positions 13 and 9) corresponding to the most recent 2 occurrences of the substring 'abc' in the input data history. As such, the primary match result 315 determined by the match engine 215 of the data redundancy searcher 105 for stream position 17 has a length of just 3, although a potential match of length 6 exists at prior stream position 3. Backward matching as implemented by the data redundancy searcher 105 makes it possible to find this length 6 match through use of respective ones of the 3 backward match results available for subsequent stream positions 18, 19 and 20 that align with current stream position 17. For example, at subsequent stream position 18, when the string 'bcd' is hashed, the hash table 210 returns a single history address corresponding to stream position 4, which is where 'bcd' was previously seen, because the search depth of 2 has not yet been met for this string. The match engine 215 finds a primary match result of length 5 at the prior stream position of 4 for the subsequent stream position of 18, which corresponds to the string 'bcdef.' Furthermore, as prior byte 'a' at (position minus 1) relative to the current and prior position also match, the match engine 215 finds a first (position minus 1) backward match result of length 6 for stream position 18. The results evaluator 230 then determines the output match result for stream position 17 to be best match result (e.g., having the longest matching string length) from among the group of match results include the primary match result (which has a length of 3), the first (position minus 1) backward match result for stream position 18 (which has a length of 6), the second (position minus 2) backward match result for stream position 19 (which has a length of 6) and the third (position minus 3) backward match result for stream position 20 (which has a length of 6). In the illustrated example, the results evaluator 230 selects the first (position minus 1) backward match result for stream position 18 (which has a length of 6) as the output search result for the stream position 17. Thus, in this example, the data redundancy searcher 105 finds the best possible match using backward matching even with the limited search depth 2, whereas prior compression techniques would require a search depth of at least 3.

Figure 4:
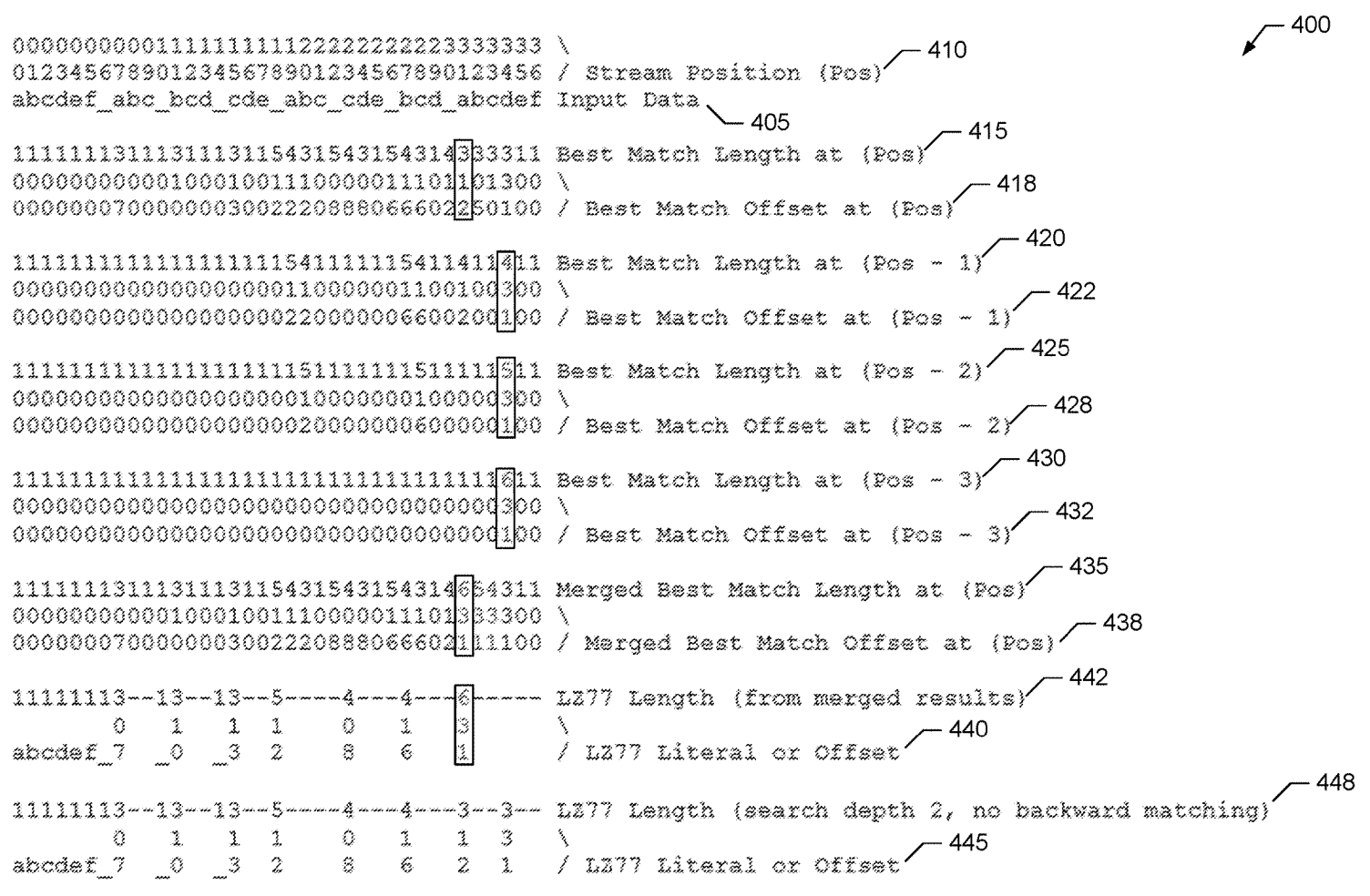

FIG. 4 illustrates another example backward matching procedure 400 performed by the example data redundancy searcher 105 of FIGS. 1 and/or 2 to determine match results for given positions of an input data stream. The example backward matching procedure 400 illustrates how backward matching as disclosed herein can improve match results when hash-based matching with a limited search depth is used for data compression. The example backward matching procedure 400 illustrates operation of the data redundancy searcher 105 with a search depth of 2 bytes and a backward matching depth of 3 bytes on 37 bytes of example input data 405 at input data stream positions 410. For example, FIG. 4 illustrates example primary match result lengths 415 and corresponding locations (e.g., offsets) 418, example first (e.g., position minus 1) backward match result lengths 420 and corresponding locations (e.g., offsets) 422, example second (e.g., position minus 2) backward match result lengths 425 and corresponding locations (e.g., offsets) 428, and example third (e.g., position minus 3) backward match result lengths 430 and corresponding locations (e.g., offsets) 432 determined by the data redundancy searcher 105 for each position 410 of the input data 405. FIG. 4 also illustrates resulting example output match result lengths 435 and corresponding locations (e.g., offsets) 438 determined by the data redundancy searcher 105 for each position 310 of the input data 305 based on the primary match results 415/418, the first (e.g., position minus 1) backward match results 420/422, the second (e.g., position minus 2) backward match results 425/428 and the third (e.g., position minus 3) backward match results 430/432. FIG. 4 further illustrates resulting example literal and pointer offset data 440, with associated matching string length data 442, that would be output by the data redundancy searcher 105 to the data element encoder 115 for the illustrated example. For comparison purposes, FIG. 4 also illustrates example literal and pointer offset data 445, with associated matching string length data 448, that might be output by a prior data compressor that does not employ backward matching as disclosed herein.

In the illustrated example backward matching procedure 400 of FIG. 4, unique 3-byte substrings in the input data stream 405 are assumed to have a unique hash and, thus, hash collisions are due to multiple occurrences in history of the same substring. Because the search depth is only 2 in the illustrated example, when the 3 bytes of input data having values 'abc' starting at stream position 31 are hashed, the hash unit 210 of the data redundancy searcher 105 supplies only 2 history addresses (e.g., stream positions 19 and 7) corresponding to the most recent 2 occurrences of the substring 'abc' in the input data history. As such, the primary match result length 415 determined by the match engine 215 of the data redundancy searcher 105 for stream position 17 is just 3, although a potential match of length 6 exists at prior stream position 0. Backward matching as implemented by the data redundancy searcher 105 makes it possible to find this length 6 match through use of respective ones of the 3 backward match results available for subsequent stream positions 32, 33 and 34 that align with current stream position 31. For example, at subsequent stream position 34, when the string 'def' is hashed, the hash table 210 returns a single history address corresponding to stream position 3, which is where 'def' was previously seen, because the search depth of 2 has not yet been met for this string. The match engine 215 finds a primary match result of length 3 at the prior stream position of 3 for the subsequent stream position of 34, which corresponds to the string 'def.' As prior byte 'c' at (position minus 1) relative to the current and prior position also match, the match engine 215 finds a first (position minus 1) backward match result of length 4 for stream position 34. Also, as prior byte 'b' at (position minus 2) relative to the current and prior position also match, the match engine 215 finds a second (position minus 2) backward match result of length 5 for stream position 34. Furthermore, as prior byte 'a' at (position minus 3) relative to the current and prior position also match, the match engine 215 finds a third (position minus 3) backward match result of length 6 for stream position 34.

The results evaluator 230 then determines the output match result for stream position 31 to be best match result (e.g., having the longest matching string length) from among the group of match results include the primary match result (which has a length of 3), the first (position minus 1) backward match result for stream position 32 (which did not yield a match in the illustrated example), the second (position minus 2) backward match result for stream position 33 (which did not yield a match in the illustrated example) and the third (position minus 3) backward match result for stream position 34 (which has a length of 6). In the illustrated example, the results evaluator 230 selects the third (position minus 3) backward match result for stream position 34 (which has a length of 6) as the output search result for the stream position 31. Thus, in this example, the data redundancy searcher 105 finds the best possible match using backward matching even with the limited search depth 2, whereas prior compression techniques would require a search depth of at least 3.

While an example manner of implementing the example data compressor 100 is illustrated in FIGS. 1-2, one or more of the elements, processes and/or devices illustrated in FIGS. 1-2 may be combined, divided, re-arranged, omitted, eliminated and/or implemented in any other way. Further, the example data redundancy searcher 105, the example input data buffer 110, the example data element encoder 115, the example compressed data buffer 120, the example stream buffer 205, the example hash unit 210, the example match engine(s) 215, the example linked list manager 220, the example history buffer 225, the example results evaluator 230, the example data replacer 235 and/or, more generally, the example data compressor 100 of FIGS. 1-2 may be implemented by hardware, software, firmware and/or any combination of hardware, software and/or firmware. Thus, for example, any of the example data redundancy searcher 105, the example input data buffer 110, the example data element encoder 115, the example compressed data buffer 120, the example stream buffer 205, the example hash unit 210, the example match engine(s) 215, the example linked list manager 220, the example history buffer 225, the example results evaluator 230, the example data replacer 235 and/or, more generally, the example data compressor 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example data compressor 100, the example data redundancy searcher 105, the example input data buffer 110, the example data element encoder 115, the example compressed data buffer 120, the example stream buffer 205, the example hash unit 210, the example match engine(s) 215, the example linked list manager 220, the example history buffer 225, the example results evaluator 230 and/or the example data replacer 235 is/are hereby expressly defined to include a non-transitory computer readable storage device or storage disk such as a memory, a digital versatile disk (DVD), a compact disk (CD), a Blu-ray disk, etc. including the software and/or firmware. Further still, the example data compressor 100 may include one or more elements, processes and/or devices in addition to, or instead of, those illustrated in FIGS. 1-2, and/or may include more than one of any or all of the illustrated elements, processes and devices.

Figure 5:
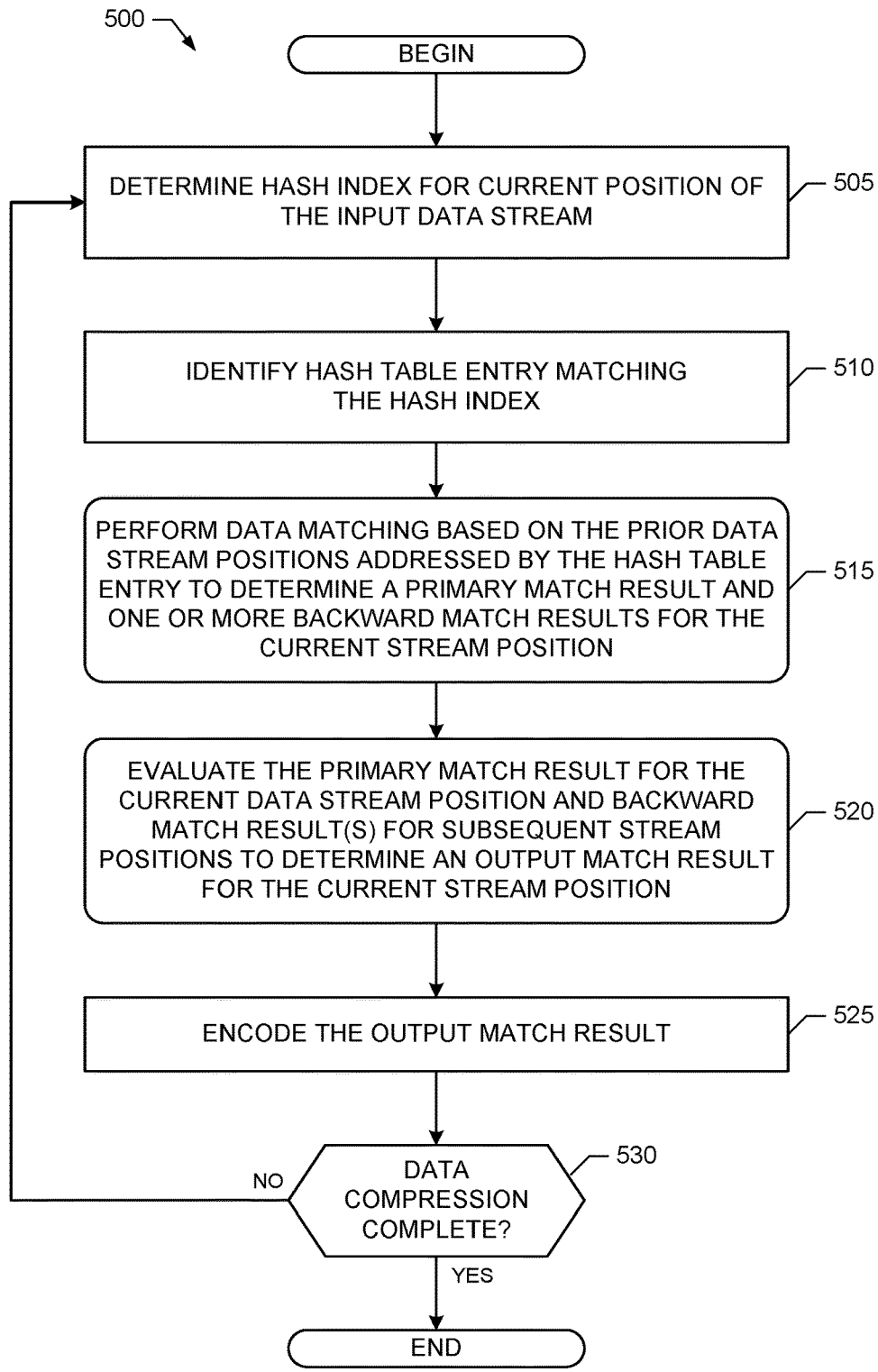
FIGS. 5-7 are flowcharts representative of example computer readable instructions that may be executed to implement the example data redundancy searcher of FIGS. 1 and/or 2.
Figure 6:
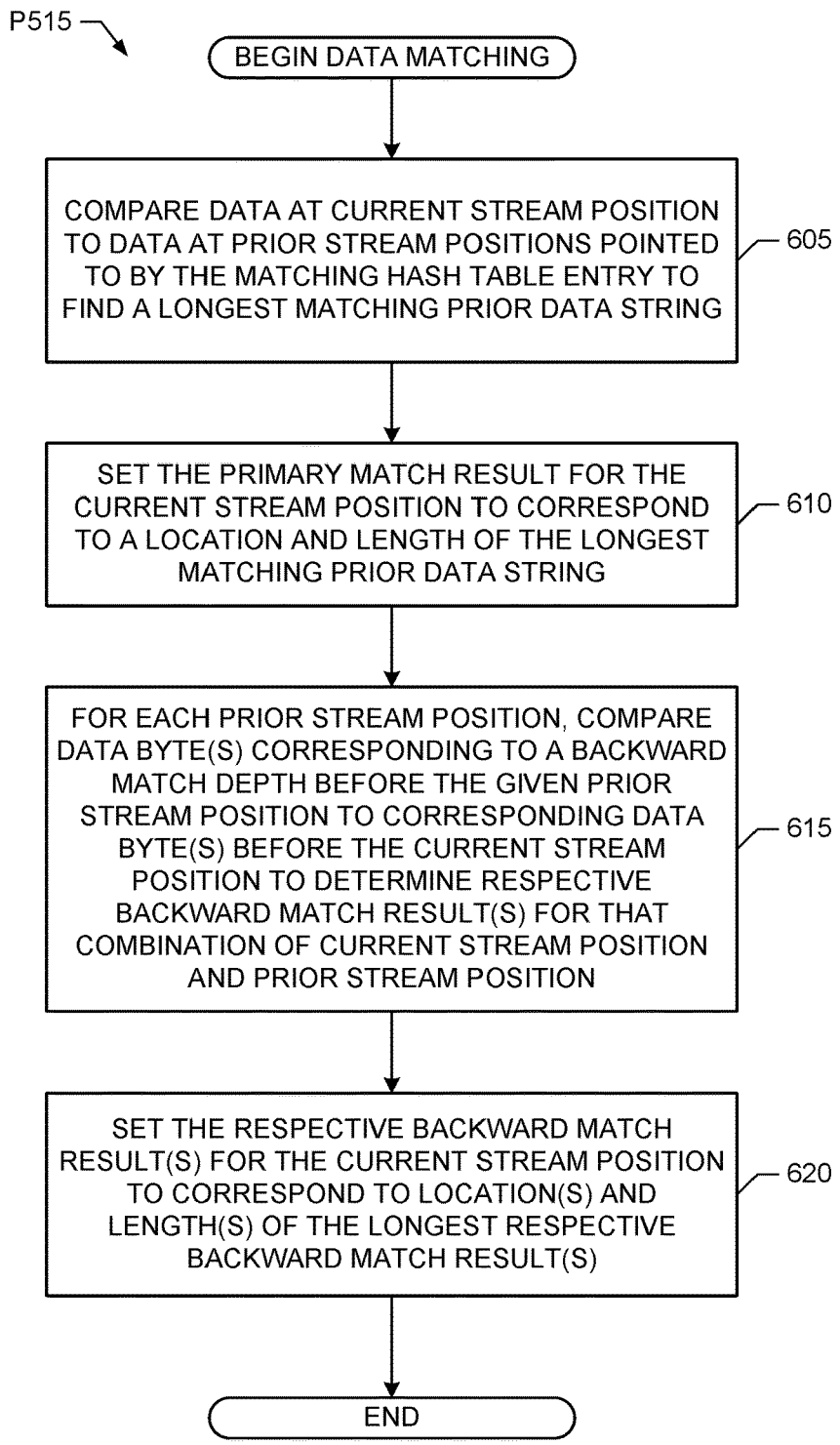
Figure 7:
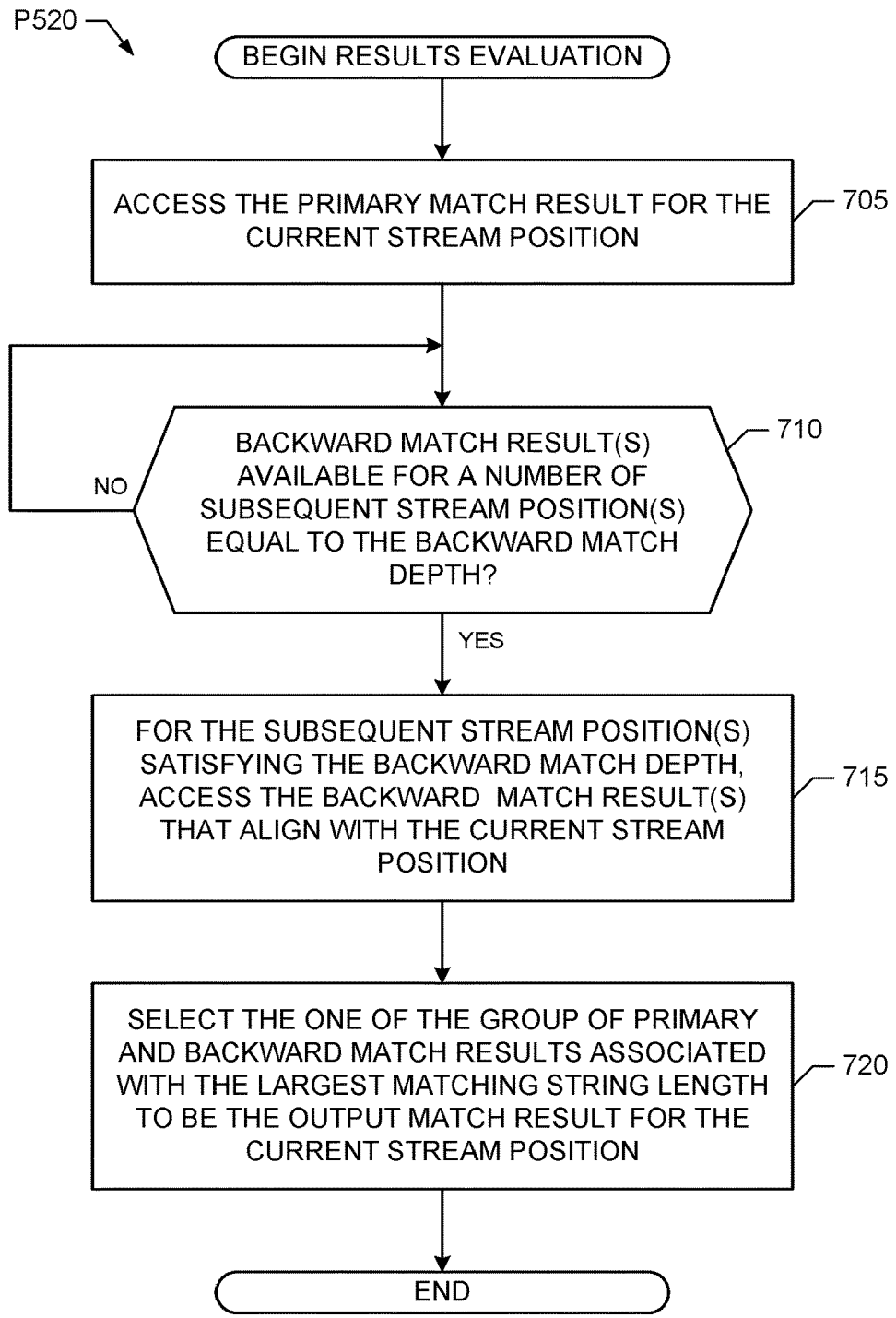

Flowcharts representative of example machine readable instructions for implementing the example data compressor 100, the example data redundancy searcher 105, the example input data buffer 110, the example data element encoder 115, the example compressed data buffer 120, the example stream buffer 205, the example hash unit 210, the example match engine(s) 215, the example linked list manager 220, the example history buffer 225, the example results evaluator 230 and/or the example data replacer 235 are shown in FIGS. 5-7. In these examples, the machine readable instructions comprise one or more programs for execution by a processor, such as the processor 812 shown in the example processor platform 800 discussed below in connection with FIG. 8. The one or more programs, or portion(s) thereof, may be embodied in software stored on one or more non-transitory computer readable storage media such as a CD-ROM, a floppy disk, a hard drive, a digital versatile disk (DVD), a Blu-ray Disk™, or a memory associated with the processor 812, but the entire program or programs and/or parts thereof could alternatively be executed by a device other than the processor 812 and/or embodied in firmware or dedicated hardware (e.g., implemented by an ASIC, a PLD, an FPLD, discrete logic, etc.). Further, although the example program(s) is(are) described with reference to the flowcharts illustrated in FIGS. 5-7, many other methods of implementing the example data compressor 100, the example data redundancy searcher 105, the example input data buffer 110, the example data element encoder 115, the example compressed data buffer 120, the example stream buffer 205, the example hash unit 210, the example match engine(s) 215, the example linked list manager 220, the example history buffer 225, the example results evaluator 230 and/or the example data replacer 235 may alternatively be used. For example, with reference to the flowcharts illustrated in FIGS. 5-7, the order of execution of the blocks may be changed, and/or some of the blocks described may be changed, eliminated, combined and/or subdivided into multiple blocks. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIGS. 5-7 may be implemented using coded instructions (e.g., computer and/or machine readable instructions) stored on one or more non-transitory computer and/or machine readable media such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended. Also, as used herein, the terms "computer readable" and "machine readable" are considered equivalent unless indicated otherwise.

An example program 500 that may be executed to implement the example data compressor 100 of FIGS. 1-2 is represented by the flowchart shown in FIG. 5. With reference to the preceding figures and associated written descriptions, the example program 500 of FIG. 5 begins execution at block 505 at which the example hash unit 210 of the example data redundancy searcher 105 of the data compressor 100 determines, as described above, a hash index for a current position of the input data stream undergoing compression (e.g. which is stored in the example input data buffer 110 of the data compressor 100). At block 510, the hash unit 210 identifies a hash table entry matching the hash index, as described above. At block 515, the example match engine(s) 215 of the data redundancy searcher 105 perform data matching based on the prior stream positions addressed by the hash table entry (e.g., as stored in a hash chain of the hash table entry) to determine a primary match result and one or more backward match results for the current input data stream position, as described above. An example program that may be executed to implement the processing at block 515 is illustrated in FIG. 6, which is described in further detail below.

At block 520, the example results evaluator 230 of the data redundancy searcher 105 evaluates the primary match result determined by the match engine(s) 215 for the current input data stream position, and one or more backward match results determined by the match engine(s) 215 for subsequent positions of the input data stream, to determine an output match result for the current input data stream position, as described above. An example program that may be executed to implement the processing at block 520 is illustrated in FIG. 7, which is described in further detail below. At block 525, the example data element encoder 115 of the data compressor 100 encodes, as described above, the output match result obtained at block 525 to determine compressed data corresponding to the current input data stream position. At block 530, the data compressor 100 determines whether compression of the input data stream is complete. If compression is not complete (block 530), processing returns to block 505 and blocks subsequent thereto to permit the data compressor 100 to continue compressing the input data stream. Otherwise, execution of the example program 500 ends.

An example program P515 that may be executed to implement the data matching processing at block 515 of FIG. 5 is represented by the flowchart shown in FIG. 6. With reference to the preceding figures and associated written descriptions, the example program P515 of FIG. 6 begins execution at block 605 at which the example match engine 215 of the example data redundancy searcher 105 of the example data compressor 100 compares data beginning at the current input data stream position undergoing compression (or matching) to data at the prior data stream position(s) addressed by the matching hash table entry to find a longest prior data string, as described above. At block 610, the match engine 215 sets, as described above, the primary match result for the current input data stream position to correspond to a location (e.g., offset) and length of the longest matching prior data stream found at block 610. At block 615, for each of the prior data stream position(s) addressed by the matching hash table entry, the match engine 215 also compares one or more data bytes corresponding to a backward matching depth before the given prior data stream position to corresponding one or more data bytes before the current input data stream position to determine respective one or more backward match results for that combination of current input data stream position and prior data stream position, as described above. At block 620, the match engine 215 sets, as described above, the respective one or more backward match results for the current stream position to correspond to the location(s) (e.g., offset(s)) and length(s) of the longest respective backward match results found at block 615.

An example program P520 that may be executed to implement the results evaluation processing at block 520 of FIG. 5 is represented by the flowchart shown in FIG. 7. With reference to the preceding figures and associated written descriptions, the example program P520 of FIG. 7 begins execution at block 705 at which the example results evaluator 230 of the example data redundancy searcher 105 of the example data compressor 100 accesses the primary match result determined for the current input data stream position. At block 710, the results evaluator 230 confirms that backward match results are available for a number of subsequent input data stream position(s) corresponding to the backward matching depth, as described above. At block 715, the results evaluator 230 accesses, for each subsequent input data stream position corresponding to the backward matching depth, the backward match results that align with the current input data stream position. For example, assuming a backward matching depth greater than or equal to 1, for the subsequent input data stream position that is one position after the current stream position undergoing compression, the results evaluator 230 accesses the first backward match result corresponding to one position before that subsequent data stream position. Assuming a backward matching depth greater than or equal to 2, for the subsequent input data stream position that is two positions after the current stream position undergoing compression, the results evaluator 230 accesses the second backward match result corresponding to two positions before that subsequent data stream position. Assuming a backward matching depth greater than or equal to 3, for the subsequent input data stream position that is three positions after the current stream position undergoing compression, the results evaluator 230 accesses the third backward match result corresponding to three positions before that subsequent data stream position. At block 720, the results evaluator 230 selects, as described above, the one of the group of match results including the primary match result accessed at block 705 and the backward match result(s) accessed at block 715 that has the longest matching string length to be the output match result for the current input data stream position undergoing compression.

Figure 8:
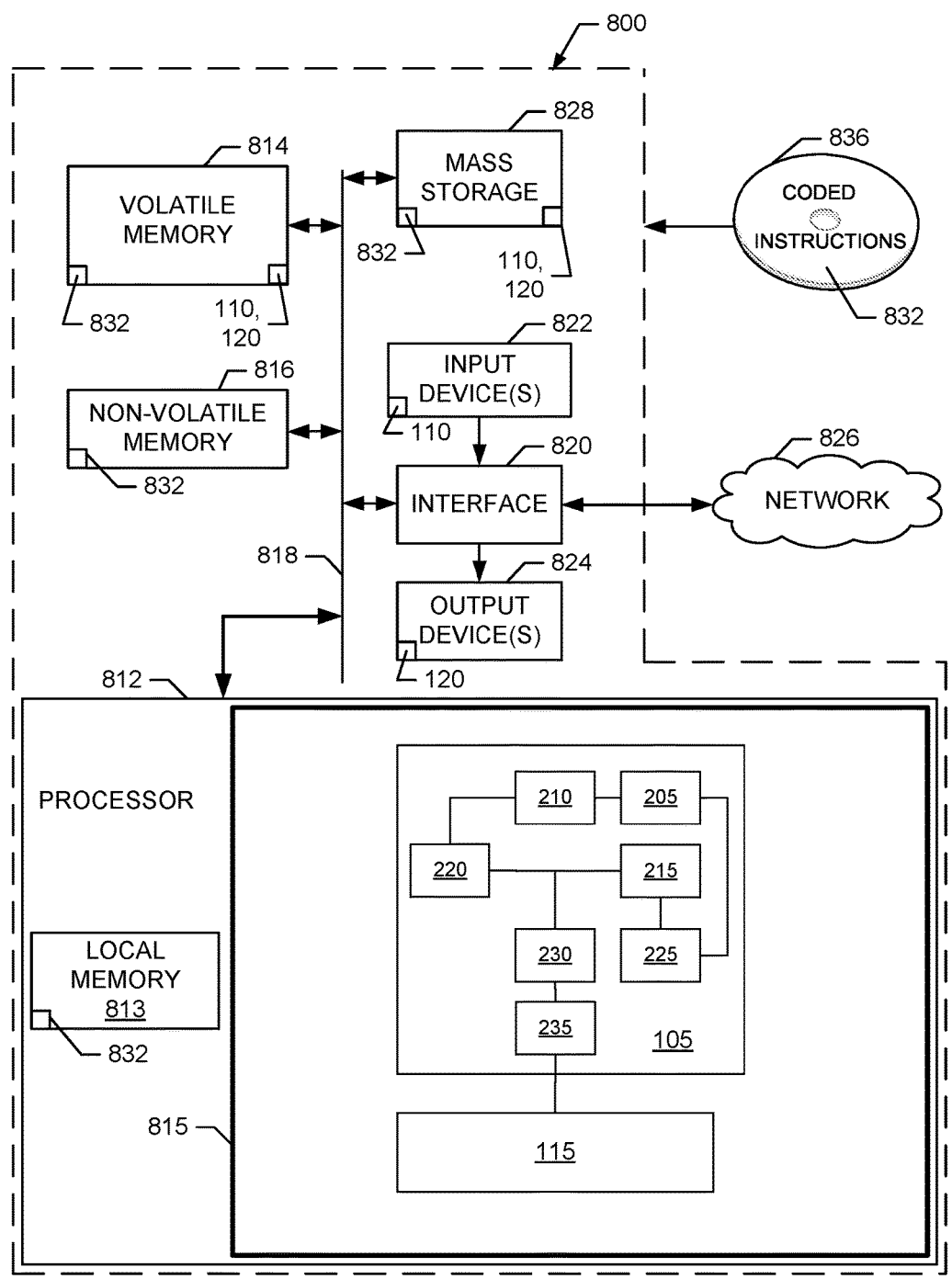
FIG. 8 is a block diagram of an example processor platform structured to execute the example computer readable instructions of FIGS. 5, 6 and/or 7 to implement the example data redundancy searcher of FIGS. 1 and/or 2 in the example data compressor of FIG. 1.

FIG. 8 is a block diagram of an example processor platform 800 structured to execute the instructions of FIGS. 5-7 to implement the example data compressor 100 of FIGS. 1-2. The processor platform 800 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box a digital camera, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer. The hardware processor 812 may be a semiconductor based (e.g., silicon based) device. In this example, the processor 812 implements the example data redundancy searcher 105, the example data element encoder 115, the example stream buffer 205, the example hash unit 210, the example match engine(s) 215, the example linked list manager 220, the example history buffer 225, the example results evaluator 230 and the example data replacer 235.

The processor 812 of the illustrated example includes a local memory 813 (e.g., a cache). The processor 812 of the illustrated example is in communication with a main memory including a volatile memory 814 and a non-volatile memory 816 via a link 818. The link 818 may be implemented by a bus, one or more point-to-point connections, etc., or a combination thereof. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 800, can allow the user to control the computer system and provide data to the computer using physical gestures, such as, but not limited to, hand or body movements, facial expressions, and face recognition. In some example, the input data device(s) 822 implement the example input data buffer 110.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 820 of the illustrated example, thus, typically includes a graphics driver card, a graphics driver chip or a graphics driver processor. In some examples, the output data device(s) 824 implement the example compressed data buffer 120.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID (redundant array of independent disks) systems, and digital versatile disk (DVD) drives. In some examples, the mass storage device(s) 828 implement the example input data buffer 110 and/or the example compressed data buffer 120. Additionally or alternatively, in some examples the volatile memory 814 implements the example input data buffer 110 and/or the example compressed data buffer 120.

Coded instructions 832 corresponding to the instructions of FIGS. 5-7 may be stored in the mass storage device 828, in the volatile memory 814, in the non-volatile memory 816, in the local memory 813 and/or on a removable tangible computer readable storage medium, such as a CD or DVD 836.

The foregoing disclosure provides examples of enhancing hash-based data matching with backward matching for data compression. The following further examples, which include subject matter such as a data compressor to perform hash-based matching with backward matching for data compression, at least one computer-readable storage medium including instructions that, when executed by at least one processor, cause the at least one processor to perform hash-based matching with backward matching for data compression, data compressions means for performing hash-based matching with backward matching for data compression, and a method to perform hash-based matching with backward matching for data compression, are disclosed herein. The disclosed examples can be implemented individually and/or in one or more combinations.

Example 1 is a data compressor including a hash unit to identify a hash table entry matching a hash index determined for a current position of a data stream undergoing data compression, the hash table entry identifying one or more prior positions of the data stream. The data compressor of example 1 also includes a match engine to perform data matching based on the current position of the data stream and the one or more prior positions of the data stream to determine a primary match result and a backward match result for the current position of the data stream. The data compressor of example 1 further includes a results evaluator to determine an output match result for the current position of the data stream based on the primary match result for the current position of the data stream and a backward match result determined for a subsequent position of the data stream.

Example 2 includes the subject matter of example 1, wherein a number of prior positions of the data stream the hash table entry is permitted to identify is limited to a search depth.

Example 3 includes the subject matter of example 1 or example 2, wherein the primary match result specifies a location and a length of a first prior data string in the data stream matching data beginning at the current position of the data stream, and the backward match result specifies a length of a second prior data string in the data stream beginning at least one position before the location of the first prior data string and matching data beginning at least one position before the current position of the data stream.

Example 4 includes the subject matter of example 3, wherein the backward match result for the current position of the data stream is a first backward match result for the current position of the data stream, and respective positions of the data stream correspond to respective bytes of the data stream.

Example 5 includes the subject matter of example 4, wherein to perform the data matching, the match engine is to (i) compare the data beginning at the current position of the data stream with data beginning at a first one of the prior positions of the data stream to determine the location and the length of the first prior data string in the data stream; and (ii)

compare data bytes at respective positions before the location of the first prior data string to respective data bytes located at respective positions before the current position of the data stream to determine respective backward match results, including the first backward match result, for the current position of the data stream, the respective backward match results being associated with the respective positions before the current position of the data stream.

Example 6 includes the subject matter of example 5, wherein to determine the first backward match result, the match engine is to (i) add one to the length of the first prior data string to determine the length of the second prior data string in the data stream if the respective data byte located one position before the location of the first prior data string matches the respective data byte located one position before the current position of the data stream; and (ii) set the length of the second prior data string in the data stream to zero if the respective data byte located one position before the location of the first prior data string does not match the respective data byte located one position before the current position of the data stream.

Example 7 includes the subject matter of example 5, wherein the match engine is configured with a backward matching depth corresponding to a number of the backward match results to be determined for the current position of the data stream.

Example 8 includes the subject matter of any one of examples 1 to 7, wherein to determine the output match result for the current position of the data stream, the results evaluator is to (i) select the backward match result for the subsequent position of the data stream to be the output match result for the current position of the data stream if a length of the backward match result for the subsequent position of the data stream is greater than the length of the primary match result for the current position of the data stream; and (ii) select the primary match result for the current position of the data stream to be the output match result for the current position of the data stream if the length of the backward match result for the subsequent position of the data stream is not greater than the length of the primary match result for the current position of the data stream.

Example 9 includes the subject matter of example 8, wherein the subsequent position is a first subsequent position of the data stream located one position after the current position of the data stream, the backward match result for the first subsequent position is associated with a location of the data stream one position before the first subsequent position.

Example 10 includes the subject matter of example 9, wherein to determine the output match result for the current position of the data stream, the results evaluator is further to (i) select a backward match result for a second subsequent position of the data stream to be the output match result for the current position of the data stream if a length of the backward match result for the second subsequent position of the data stream is greater than the length of the backward match result for the first subsequent position of the data stream and the length of the primary match result for the current position of the data stream, the second subsequent position being located two positions after the current position of the data stream, the backward match result for the second subsequent position being associated with a location of the data stream two positions before the second subsequent position; (ii) select the backward match result for the first subsequent position of the data stream to be the output match result for the current position of the data stream if the length of the backward match result for the second subsequent position of the data stream is not greater than the length of the backward match result for the first subsequent position of the data stream and the length of the backward match result for the first subsequent position of the data stream is greater than the length of the primary match result for the current position of the data stream; and (iii) select the primary match result for the current position of the data stream to be the output match result for the current position of the data stream if the length of the backward match result for the first subsequent position of the data stream and the length of the backward match result for the second subsequent position of the data stream are not greater than the length of the primary match result for the current position of the data stream.

Example 11 includes one or more non-transitory computer readable storage media including computer readable instructions which, when executed, cause one or more processors to at least (i) identify a hash table entry matching a hash index determined for a current position of a data stream undergoing data compression, the hash table entry identifying one or more prior positions of the data stream; (ii) perform data matching based on the current position of the data stream and the one or more prior positions of the data stream to determine a primary match result and a backward match result for the current position of the data stream; and (iii) determine an output match result for the current position of the data stream based on the primary match result for the current position of the data stream and a backward match result determined for a subsequent position of the data stream.

Example 12 includes the subject matter of example 11, wherein a number of prior positions of the data stream the hash table entry is permitted to identify is limited to a search depth.

Example 13 includes the subject matter of example 11 or example 12, wherein the primary match result specifies a location and a length of a first prior data string in the data stream matching data beginning at the current position of the data stream, and the backward match result specifies a length of a second prior data string in the data stream beginning at least one position before the location of the first prior data string and matching data beginning at least one position before the current position of the data stream.

Example 14 includes the subject matter of example 13, wherein the backward match result for the current position of the data stream is a first backward match result for the current position of the data stream, and respective positions of the data stream correspond to respective bytes of the data stream.

Example 15 includes the subject matter of example 14, wherein the instructions cause the one or more processors to perform the data matching by (i) comparing the data beginning at the current position of the data stream with data beginning at a first one of the prior positions of the data stream to determine the location and the length of the first prior data string in the data stream; and (ii) comparing data bytes at respective positions before the location of the first prior data string to respective data bytes located at respective positions before the current position of the data stream to determine respective backward match results, including the first backward match result, for the current position of the data stream, the respective backward match results being associated with the respective positions before the current position of the data stream.

Example 16 includes the subject matter of example 15, wherein the instructions cause the one or more processors to determine the first backward match result by (i) adding one to the length of the first prior data string to determine the length of the second prior data string in the data stream if the respective data byte located one position before the location of the first prior data string matches the respective data byte located one position before the current position of the data stream; and (ii) setting the length of the second prior data string in the data stream to zero if the respective data byte located one position before the location of the first prior data string does not match the respective data byte located one position before the current position of the data stream.

Example 17 includes the subject matter of example 15, wherein the instructions cause the one or more processors to access a backward matching depth corresponding to a number of the backward match results to be determined for the current position of the data stream.

Example 18 includes the subject matter of any one of examples 11 to 17, wherein the instructions cause the one or more processors to determine the output match result for the current position of the data stream by (i) selecting the backward match result for the subsequent position of the data stream to be the output match result for the current position of the data stream if a length of the backward match result for the subsequent position of the data stream is greater than the length of the primary match result for the current position of the data stream; and (ii) selecting the primary match result for the current position of the data stream to be the output match result for the current position of the data stream if the length of the backward match result for the subsequent position of the data stream is not greater than the length of the primary match result for the current position of the data stream.

Example 19 includes the subject matter of example 18, wherein the subsequent position is a first subsequent position of the data stream located one position after the current position of the data stream, and the backward match result for the first subsequent position is associated with a location of the data stream one position before the first subsequent position.

Example 20 includes the subject matter of example 19, wherein the instructions further cause the one or more processors to determine the output match result for the current position of the data stream by (i) selecting a backward match result for a second subsequent position of the data stream to be the output match result for the current position of the data stream if a length of the backward match result for the second subsequent position of the data stream is greater than the length of the backward match result for the first subsequent position of the data stream and the length of the primary match result for the current position of the data stream, the second subsequent position being located two positions after the current position of the data stream, the backward match result for the second subsequent position being associated with a location of the data stream two positions before the second subsequent position; (ii) selecting the backward match result for the first subsequent position of the data stream to be the output match result for the current position of the data stream if the length of the backward match result for the second subsequent position of the data stream is not greater than the length of the backward match result for the first subsequent position of the data stream and the length of the backward match result for the first subsequent position of the data stream is greater than the length of the primary match result for the current position of the data stream; and (iii) selecting the primary match result for the current position of the data stream to be the output match result for the current position of the data stream if the length of the backward match result for the first subsequent position of the data stream and the length of the backward match result for the second subsequent position of the data stream are not greater than the length of the primary match result for the current position of the data stream.

Example 21 is a data compression apparatus including identification means for identifying a hash table entry matching a hash index determined for a current position of a data stream undergoing data compression, the hash table entry identifying one or more prior positions of the data stream. The data compression apparatus of example 21 also includes data matching means for performing data matching based on the current position of the data stream and the one or more prior positions of the data stream to determine a primary match result and a backward match result for the current position of the data stream. The data compression apparatus of example 21 further includes evaluation means for determining an output match result for the current position of the data stream based on the primary match result for the current position of the data stream and a backward match result determined for a subsequent position of the data stream.

Example 22 includes the subject matter of example 21, wherein a number of prior positions of the data stream the hash table entry is permitted to identify is limited to a search depth.

Example 23 includes the subject matter of example 21 or example 22, wherein the primary match result specifies a location and a length of a first prior data string in the data stream matching data beginning at the current position of the data stream, and the backward match result specifies a length of a second prior data string in the data stream beginning at least one position before the location of the first prior data string and matching data beginning at least one position before the current position of the data stream.

Example 24 includes the subject matter of example 23, wherein the backward match result for the current position of the data stream is a first backward match result for the current position of the data stream, and respective positions of the data stream correspond to respective bytes of the data stream.

Example 25 includes the subject matter of example 24, wherein the data matching means performs data matching by (i) comparing the data beginning at the current position of the data stream with data beginning at a first one of the prior positions of the data stream to determine the location and length of the first prior data string in the data stream; and (ii) comparing data bytes at respective positions before the location of the first prior data string to respective data bytes located at respective positions before the current position of the data stream to determine respective backward match results, including the first backward match result, for the current position of the data stream, the respective backward match results being associated with the respective positions before the current position of the data stream.

Example 26 includes the subject matter of example 25, wherein the data matching means determines the first backward match result by (i) adding one to the length of the first prior data string to determine the length of the second prior data string in the data stream if the respective data byte located one position before the location of the first prior data string matches the respective data byte located one position before the current position of the data stream; and (ii) setting the length of the second prior data string in the data stream to zero if the respective data byte located one position before the location of the first prior data string does not match the respective data byte located one position before the current position of the data stream.

Example 27 includes the subject matter of example 25, wherein the data matching means is configured with a backward matching depth corresponding to a number of the backward match results to be determined for the current position of the data stream.

Example 28 includes the subject matter of any one of examples 21 to 27, wherein the evaluation means determines the output match result for the current position of the data stream by (i) selecting the backward match result for the subsequent position of the data stream to be the output match result for the current position of the data stream if a length of the backward match result for the subsequent position of the data stream is greater than the length of the primary match result for the current position of the data stream; and (ii) selecting the primary match result for the current position of the data stream to be the output match result for the current position of the data stream if the length of the backward match result for the subsequent position of the data stream is not greater than the length of the primary match result for the current position of the data stream.

Example 29 includes the subject matter of example 28, wherein the subsequent position is a first subsequent position of the data stream located one position after the current position of the data stream, and the backward match result for the first subsequent position is associated with a location of the data stream one position before the first subsequent position.

Example 30 includes the subject matter of example 29, wherein the evaluation means further determines the output match result for the current position of the data stream by (i) selecting a backward match result for a second subsequent position of the data stream to be the output match result for the current position of the data stream if a length of the backward match result for the second subsequent position of the data stream is greater than the length of the backward match result for the first subsequent position of the data stream and the length of the primary match result for the current position of the data stream, the second subsequent position being located two positions after the current position of the data stream, the backward match result for the second subsequent position being associated with a location of the data stream two positions before the second subsequent position; (ii) selecting the backward match result for the first subsequent position of the data stream to be the output match result for the current position of the data stream if the length of the backward match result for the second subsequent position of the data stream is not greater than the length of the backward match result for the first subsequent position of the data stream and the length of the backward match result for the first subsequent position of the data stream is greater than the length of the primary match result for the current position of the data stream; and (iii) selecting the primary match result for the current position of the data stream to be the output match result for the current position of the data stream if the length of the backward match result for the first subsequent position of the data stream and the length of the backward match result for the second subsequent position of the data stream are not greater than the length of the primary match result for the current position of the data stream.

Example 31 is a data compression method including identifying a hash table entry matching a hash index determined for a current position of a data stream undergoing data compression, the hash table entry identifying one or more prior positions of the data stream. The method of example 31 also includes performing data matching based on the current position of the data stream and the one or more prior positions of the data stream to determine a primary match result and a backward match result for the current position of the data stream. The method of example 31 further includes determining an output match result for the current position of the data stream based on the primary match result for the current position of the data stream and a backward match result determined for a subsequent position of the data stream.

Example 32 includes the subject matter of example 31, wherein a number of prior positions of the data stream the hash table entry is permitted to identify is limited to a search depth.

Example 33 includes the subject matter of example 31 or example 32, wherein the primary match result specifies a location and a length of a first prior data string in the data stream matching data beginning at the current position of the data stream, and the backward match result specifies a length of a second prior data string in the data stream beginning at least one position before the location of the first prior data string and matching data beginning at least one position before the current position of the data stream.

Example 34 includes the subject matter of example 33, wherein the backward match result for the current position of the data stream is a first backward match result for the current position of the data stream, and respective positions of the data stream correspond to respective bytes of the data stream.

Example 35 includes the subject matter of example 34, wherein the performing of the data matching includes (i) comparing the data beginning at the current position of the data stream with data beginning at a first one of the prior positions of the data stream to determine the location and the length of the first prior data string in the data stream; and (ii) comparing data bytes at respective positions before the location of the first prior data string to respective data bytes located at respective positions before the current position of the data stream to determine respective backward match results, including the first backward match result, for the current position of the data stream, the respective backward match results being associated with the respective positions before the current position of the data stream.

Example 36 includes the subject matter of example 35, wherein the performing of the data matching includes determining the first backward match result by (i) adding one to the length of the first prior data string to determine the length of the second prior data string in the data stream if the respective data byte located one position before the location of the first prior data string matches the respective data byte located one position before the current position of the data stream; and (ii) setting the length of the second prior data string in the data stream to zero if the respective data byte located one position before the location of the first prior data string does not match the respective data byte located one position before the current position of the data stream.

Example 37 includes the subject matter of example 35, and further includes accessing a backward matching depth corresponding to a number of the backward match results to be determined for the current position of the data stream.

Example 38 includes the subject matter of any one of examples 31 to 37, wherein the determining of the output match result for the current position of the data stream includes (i) selecting the backward match result for the subsequent position of the data stream to be the output match result for the current position of the data stream if a length of the backward match result for the subsequent position of the data stream is greater than the length of the primary match result for the current position of the data stream; and (ii) selecting the primary match result for the current position of the data stream to be the output match result for the current position of the data stream if the length of the backward match result for the subsequent position of the data stream is not greater than the length of the primary match result for the current position of the data stream.

Example 39 includes the subject matter of example 38, wherein the subsequent position is a first subsequent position of the data stream located one position after the current position of the data stream, and the backward match result for the first subsequent position is associated with a location of the data stream one position before the first subsequent position.

Example 40 includes the subject matter of example 39, wherein the determining of the output match result for the current position of the data stream further includes (i) selecting a backward match result for a second subsequent position of the data stream to be the output match result for the current position of the data stream if a length of the backward match result for the second subsequent position of the data stream is greater than the length of the backward match result for the first subsequent position of the data stream and the length of the primary match result for the current position of the data stream, the second subsequent position being located two positions after the current position of the data stream, the backward match result for the second subsequent position being associated with a location of the data stream two positions before the second subsequent position; (ii) selecting the backward match result for the first subsequent position of the data stream to be the output match result for the current position of the data stream if the length of the backward match result for the second subsequent position of the data stream is not greater than the length of the backward match result for the first subsequent position of the data stream and the length of the backward match result for the first subsequent position of the data stream is greater than the length of the primary match result for the current position of the data stream; and (iii) selecting the primary match result for the current position of the data stream to be the output match result for the current position of the data stream if the length of the backward match result for the first subsequent position of the data stream and the length of the backward match result for the second subsequent position of the data stream are not greater than the length of the primary match result for the current position of the data stream.

Example 41 includes one or more computer readable storage media including computer readable instructions which, when executed, cause one or more processors to perform the method of any one of examples 31 to 40.

Example 42 is an apparatus including one or more processors to perform the method of any one of examples 31 to 40.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A data compressor comprising:
  a hash unit to identify a hash table entry matching a hash index determined for a current position of a data stream undergoing data compression, the hash table entry identifying one or more prior positions of the data stream;
  a match engine to perform data matching based on the current position of the data stream and the one or more prior positions of the data stream to determine a primary match result and a backward match result for the current position of the data stream, the one or more prior positions of the data stream identified by the hash unit; and
  a results evaluator to determine an output match result for the current position of the data stream based on the primary match result determined by the match engine for the current position of the data stream and a backward match result determined by the match engine for a subsequent position of the data stream, at least one of the hash unit, the match engine or the results evaluator implemented by hardware.

2. The data compressor of claim 1, wherein a number of prior positions of the data stream the hash table entry is to identify is limited to a search depth.

3. The data compressor of claim 1, wherein the primary match result specifies: (i) a location and (ii) a length of a first prior data string in the data stream matching data beginning at the current position of the data stream, and the backward match result specifies: (i) a length of a second prior data string in the data stream beginning at least one position before the location of the first prior data string and (ii) matching data beginning at least one position before the current position of the data stream.

4. The data compressor of claim 3, wherein the backward match result for the current position of the data stream is a first backward match result for the current position of the data stream, and respective positions of the data stream correspond to respective bytes of the data stream.

5. The data compressor of claim 4, wherein the match engine is to:
  compare the data beginning at the current position of the data stream with data beginning at a first one of the prior positions of the data stream to determine the location and the length of the first prior data string in the data stream; and
  compare data bytes at respective positions before the location of the first prior data string to respective data bytes located at respective positions before the current position of the data stream to determine respective backward match results for the current position of the data stream, the backward match results being associated with the respective positions before the current position of the data stream, the backward match results including the first backward match result.

6. The data compressor of claim 5, wherein to determine the first backward match result, the match engine is to:
  add one to the length of the first prior data string to determine the length of the second prior data string in the data stream if the respective data byte located one position before the location of the first prior data string matches the respective data byte located one position before the current position of the data stream; and
  set the length of the second prior data string in the data stream to zero if the respective data byte located one position before the location of the first prior data string does not match the respective data byte located one position before the current position of the data stream.

7. The data compressor of claim 5, wherein the match engine is associated with a backward matching depth corresponding to a number of the backward match results to be determined for the current position of the data stream.

8. The data compressor of claim 1, wherein the results evaluator is further to:

select the backward match result for the subsequent position of the data stream to be the output match result for the current position of the data stream if a length of the backward match result for the subsequent position of the data stream is greater than the length of the primary match result for the current position of the data stream; and select the primary match result for the current position of the data stream to be the output match result for the current position of the data stream if the length of the backward match result for the subsequent position of the data stream is not greater than the length of the primary match result for the current position of the data stream.

9. The data compressor of claim 8, wherein the subsequent position is a first subsequent position of the data stream located one position after the current position of the data stream, and the backward match result for the first subsequent position is associated with a location of the data stream one position before the first subsequent position.

10. The data compressor of claim 9, wherein to determine the output match result for the current position of the data stream, the results evaluator is further to:

select a backward match result for a second subsequent position of the data stream to be the output match result for the current position of the data stream if a length of the backward match result for the second subsequent position of the data stream is greater than: (i) the length of the backward match result for the first subsequent position of the data stream and (ii) the length of the primary match result for the current position of the data stream, the second subsequent position being located two positions after the current position of the data stream, the backward match result for the second subsequent position being associated with a location of the data stream two positions before the second subsequent position;

select the backward match result for the first subsequent position of the data stream to be the output match result for the current position of the data stream if: (i) the length of the backward match result for the second subsequent position of the data stream is not greater than the length of the backward match result for the first subsequent position of the data stream and (ii) the length of the backward match result for the first subsequent position of the data stream is greater than the length of the primary match result for the current position of the data stream; and select the primary match result for the current position of the data stream to be the output match result for the current position of the data stream if neither the length of the backward match result for the first subsequent position of the data stream nor the length of the backward match result for the second subsequent position of the data stream is greater than the length of the primary match result for the current position of the data stream.

11. One or more non-transitory computer readable storage media comprising computer readable instructions which, when executed by one or more processors, cause the one or more processors to at least:

identify a hash table entry in memory matching a hash index determined for a current position of a data stream stored in an input data buffer, the hash table entry to identify one or more prior positions of the data stream in the input data buffer;

perform data matching based on the current position of the data stream in the input data buffer and the one or more prior positions of the data stream in the input data buffer to determine a primary match result and a backward match result for the current position of the data stream in the input data buffer; and determine an output match result to be encoded to form compressed data based on the data stream to store in a second data buffer, the compressed data corresponding to the current position of the data stream, the output match result determined based on the primary match result for the current position of the data stream and a backward match result determined for a subsequent position of the data stream.

12. The one or more storage media of claim 11, wherein a number of prior positions of the data stream in the hash table entry is limited to a search depth.

13. The one or more storage media of claim 11, wherein the primary match result is to specify: (i) a location and (ii) a length of a first prior data string in the data stream matching data beginning at the current position of the data stream, and the backward match result is to specify: (i) a length of a second prior data string in the data stream beginning at least one position before the location of the first prior data string and (ii) matching data beginning at least one position before the current position of the data stream.

14. The one or more storage media of claim 13, wherein the backward match result for the current position of the data stream is a first backward match result for the current position of the data stream, and respective positions of the data stream correspond to respective bytes of the data stream.

15. The one or more storage media of claim 14, wherein the instructions cause the one or more processors to perform the data matching by:

comparing the data beginning at the current position of the data stream with data beginning at a first one of the prior positions of the data stream to determine the location and the length of the first prior data string in the data stream; and comparing data bytes at respective positions before the location of the first prior data string to respective data bytes located at respective positions before the current position of the data stream to determine respective backward match results for the current position of the data stream, the backward match results being associated with the respective positions before the current position of the data stream, the backward match results including the first backward match result.

16. The one or more storage media of claim 15, wherein the instructions cause the one or more processors to determine the first backward match result by:

adding one to the length of the first prior data string to determine the length of the second prior data string in the data stream if the respective data byte located one position before the location of the first prior data string matches the respective data byte located one position before the current position of the data stream; and setting the length of the second prior data string in the data stream to zero if the respective data byte located one position before the location of the first prior data string does not match the respective data byte located one position before the current position of the data stream.

17. The one or more storage media of claim 15, wherein the instructions cause the one or more processors to access a backward matching depth corresponding to a number of the backward match results to be determined for the current position of the data stream.

18. The one or more storage media of claim 11, wherein the instructions cause the one or more processors to determine the output match result for the current position of the data stream by:
selecting the backward match result for the subsequent position of the data stream to be the output match result for the current position of the data stream if a length of the backward match result for the subsequent position of the data stream is greater than the length of the primary match result for the current position of the data stream; and
selecting the primary match result for the current position of the data stream to be the output match result for the current position of the data stream if the length of the backward match result for the subsequent position of the data stream is not greater than the length of the primary match result for the current position of the data stream.

19. The one or more storage media of claim 18, wherein the subsequent position is a first subsequent position of the data stream located one position after the current position of the data stream, and the backward match result for the first subsequent position is associated with a location of the data stream one position before the first subsequent position.

20. The one or more storage media of claim 19, wherein the instructions further cause the one or more processors to determine the output match result for the current position of the data stream by:
selecting a backward match result for a second subsequent position of the data stream to be the output match result for the current position of the data stream if a length of the backward match result for the second subsequent position of the data stream is greater than: (i) the length of the backward match result for the first subsequent position of the data stream and (ii) the length of the primary match result for the current position of the data stream, the second subsequent position being located two positions after the current position of the data stream, the backward match result for the second subsequent position being associated with a location of the data stream two positions before the second subsequent position;
selecting the backward match result for the first subsequent position of the data stream to be the output match result for the current position of the data stream if: (i) the length of the backward match result for the second subsequent position of the data stream is not greater than the length of the backward match result for the first subsequent position of the data stream and (ii) the length of the backward match result for the first subsequent position of the data stream is greater than the length of the primary match result for the current position of the data stream; and
selecting the primary match result for the current position of the data stream to be the output match result for the current position of the data stream if neither the length of the backward match result for the first subsequent position of the data stream nor the length of the backward match result for the second subsequent position of the data stream is greater than the length of the primary match result for the current position of the data stream.

21. A data compression method comprising:
identifying, by executing an instruction with at least one processor, a hash table entry in memory matching a hash index determined for a current position of a data stream stored in an input data buffer, the hash table entry identifying one or more prior positions of the data stream in the input data buffer;
performing, by executing an instruction with the at least one processor, data matching based on the current position of the data stream in the input data buffer and the one or more prior positions of the data stream in the input data buffer to determine a primary match result and a backward match result for the current position of the data stream in the input data buffer; and
determining, by executing an instruction with the at least one processor, an output match result to be encoded to form compressed data based on the data stream to store in a second data buffer, the compressed data corresponding to the current position of the data stream, the output match result determined based on the primary match result for the current position of the data stream and a backward match result determined for a subsequent position of the data stream.

22. The method of claim 21, wherein the primary match result specifies: (i) a location and (ii) a length of a first prior data string in the data stream matching data beginning at the current position of the data stream, and the backward match result specifies: (i) a length of a second prior data string in the data stream beginning at least one position before the location of the first prior data string and (ii) matching data beginning at least one position before the current position of the data stream.

23. The method of claim 22, wherein the backward match result for the current position of the data stream is a first backward match result for the current position of the data stream, and respective positions of the data stream correspond to respective bytes of the data stream.

24. The method of claim 23, wherein the performing of the data matching includes:
comparing the data beginning at the current position of the data stream with data beginning at a first one of the prior positions of the data stream to determine the location and the length of the first prior data string in the data stream; and
comparing data bytes at respective positions before the location of the first prior data string to respective data bytes located at respective positions before the current position of the data stream to determine respective backward match results for the current position of the data stream, the respective backward match results being associated with the respective positions before the current position of the data stream, the backward match results including the first backward match result.

25. The method of claim 24, wherein the performing of the data matching includes determining the first backward match result by:
adding one to the length of the first prior data string to determine the length of the second prior data string in the data stream if the respective data byte located one position before the location of the first prior data string matches the respective data byte located one position before the current position of the data stream; and
setting the length of the second prior data string in the data stream to zero if the respective data byte located one position before the location of the first prior data string does not match the respective data byte located one position before the current position of the data stream.

26. The method of claim 21, wherein the determining of the output match result for the current position of the data stream includes:
- selecting the backward match result for the subsequent position of the data stream to be the output match result for the current position of the data stream if a length of the backward match result for the subsequent position of the data stream is greater than the length of the primary match result for the current position of the data stream; and
- selecting the primary match result for the current position of the data stream to be the output match result for the current position of the data stream if the length of the backward match result for the subsequent position of the data stream is not greater than the length of the primary match result for the current position of the data stream.

* * * * *